United States Patent
Matsui et al.

(10) Patent No.: US 8,150,342 B2
(45) Date of Patent: Apr. 3, 2012

(54) TRANSMITTER, RF TRANSMITTER SIGNAL PROCESSOR AND METHOD FOR OPERATION OF TRANSMITTER

(75) Inventors: Hiroaki Matsui, Tokyo (JP); Yasuo Shima, Tokyo (JP); Yasuyuki Kimura, Tokyo (JP); Masahiko Yamamoto, Tokyo (JP)

(73) Assignee: Renesas Electronics Corporation, Kanagawa (JP)

(*) Notice: Subject to any disclaimer, the term of this patent is extended or adjusted under 35 U.S.C. 154(b) by 912 days.

(21) Appl. No.: 12/109,426

(22) Filed: Apr. 25, 2008

(65) Prior Publication Data

US 2008/0287079 A1 Nov. 20, 2008

(30) Foreign Application Priority Data

Apr. 27, 2007 (JP) ................. 2007-118199

(51) Int. Cl.
*H04B 1/04* (2006.01)
*H01Q 11/12* (2006.01)
(52) U.S. Cl. .............. 455/127.2; 455/108; 455/110
(58) Field of Classification Search ............ 455/127.2, 455/108, 110, 127.1, 127.4
See application file for complete search history.

(56) References Cited

U.S. PATENT DOCUMENTS

2003/0224743 A1 12/2003 Okada et al.
2005/0135502 A1* 6/2005 Zhang et al. ............ 375/297

FOREIGN PATENT DOCUMENTS

| JP | 2002-84153 | A | 3/2002 |
|---|---|---|---|
| JP | 2002-300047 | A | 10/2002 |
| JP | 2002-335169 | A | 11/2002 |
| JP | 2003-143023 | A | 5/2003 |
| JP | 2003-215651 | A | 7/2003 |
| JP | 2004-7441 | A | 1/2004 |

OTHER PUBLICATIONS

E. McCune, High-Efficiency, Multi-Mode, Multi-Band Terminal Power Amplifiers, IEEE 2005.
A. Fogg, "DigRF Baseband Interface Specification", Logical, Electrical and Timing Characteristics EGPRS Version 1.12.

* cited by examiner

*Primary Examiner* — Christian Hannon
(74) *Attorney, Agent, or Firm* — Mattingly & Malur, PC

(57) ABSTRACT

An internal operation of RF IC is adjusted so that the level of an RF transmitter signal is substantially stopped from rising, or made to descend in course of ramp-up of the RF transmitter signal. This adjustment is enabled by ramp-up adjustment data Last 4 symbols contained in preamble data precedent to real transmission data transmitted after completion of ramp-up. The ramp-up adjustment data and real transmission data are supplied from a baseband LSI. The RF transmitter signal contains phase and amplitude modulation components according to the EDGE system. RF IC includes phase and amplitude modulation control loops PM LP and AM LP. Ramp-up of RF power amplifiers PA1 and PA2 is performed by controlling the gain of the first variable amplifier MVGA included in the AM LP according to ramp information. Thus, unwanted radiation's level is reduced during ramp-up of the RF transmitter signal of the RF power amplifiers.

29 Claims, 9 Drawing Sheets

TRANSMITTER, RF TRANSMITTER SIGNAL PROCESSOR AND METHOD FOR OPERATION OF TRANSMITTER

CLAIM OF PRIORITY

The Present application claims priority from Japanese application JP 2007-118199 filed on Apr. 27, 2007, the content of which is hereby incorporated by reference into this application.

FIELD OF THE INVENTION

The present invention relates to a transmitter, an RF transmitter signal-processing circuit used therefor, and a method for operating the transmitter. Particularly, it relates to a technique beneficial to reduce the level of unwanted radiation in ramp-up and ramp-down of an RF transmitter signal of an RF power amplifier.

BACKGROUND OF THE INVENTION

As to communications terminal devices such as mobile phone terminals, there has been known TDMA system, in which time slots can be set for an idle state, an operation to receive a signal from a base station or an operation to send a signal to the base station. Incidentally, TDMA is an abbreviation of Time-Division Multiple Access. As the TDMA systems have been known GSM system and GMSK system, which use only phase modulation, provided that GSM is an abbreviation of Global System for Mobile Communication, and GMSK is an abbreviation of Gaussian minimum Shift Keying. In contrast with GSM and GMSK systems, systems which improve a communication data transfer rate have been known. As one of such improvement systems, EDGE system using amplitude modulation in parallel with phase modulation has been attracting attention recently. Incidentally, EDGE is an abbreviation of Enhanced Data for GSM Evolution or Enhanced Data for GPRS, and GPRS is an abbreviation of General Packet Radio Service.

As a method to materialize the EDGE system has been known a polar loop system including: separating a transmitter signal, which must be sent out, into phase and amplitude components; then performing respective feedback controls with phase and amplitude control loops; and combining phase and amplitude components gained after the feedback controls by means of an amplifier.

A polar loop transmitter having a phase control loop and an amplitude control loop and supporting an EDGE transmitter function is described in the Non-patent Document presented by Earl McCune, "High-Efficiency, Multi-Mode, Multi-Band Terminal Power Amplifiers", IEEE microwave magazine, March 2005, PP. 44-45. According to the document, it is described that the power efficiency is a key market issue for mobile phones, and in a polar loop system, an RF power amplifier operating in a condition near saturation offers the advantage of a better power efficiency. Also, it is described that an additional advantage of the polar loop system posed by an operation of an RF power amplifier in such near-saturation condition is low-noise characteristics.

In contrast, specifications of a digital interface between an RF IC and a baseband LSI are stated in the Non-patent Document presented by Andrew Fogg, "DigRF BASEBAND/RF DIGITAL INTERFACE SPECIFICATION", Logical, Electrorical and Timing Characteristics EGPRS Version Digital Interface Working Group Rapporteur Andrew Fogg, TTP-Com Version 1.12 http://146.101.169.51/DigRF Standard v112.pdf (according to search on Oct. 5, 2006).

SUMMARY OF THE INVENTION

Prior to the present invention, the inventors had been engaged in development of an RF communication semiconductor integrated circuit, hereinafter referred to as "RF IC", which has a transmitter including a digital interface with a baseband LSI and enables transmission in multi modes of GMSK and EDGE systems.

It is required for EDGE amplitude modulation to control an RF transmitter signal in amplitude. Control information for EDGE amplitude modulation is contained in a transmission baseband signal produced by a baseband LSI. The control information for EDGE amplitude modulation determines the amplitude of an RF transmitter signal produced by an RF IC and supplied to an RF power amplifier (PA). As described in the preceding section, in a polar loop system materializing EDGE system, a transmitter signal is separated into a phase component and an amplitude component before respective feedback controls are performed with a phase modulation control loop (PM LP) and an amplitude modulation control loop (AM LP), and a phase component and an amplitude component obtained after the feedback controls are combined by an RF power amplifier (PA).

As described in the preceding section, with TDMA (Time Division Multiple Access) system, time slots can be set for or changed in setting to an idle state, an operation to receive a signal from a base station or an operation to send a signal to the base station. Particularly, in switching to a transmission operation time slot from another time slot, the intensity of an RF transmitter signal must be increased at an ascending rate determined by GMSK standard. The increase of the RF transmitter signal intensity of this time is termed "ramp-up". When the ascending rate of the ramp-up is larger than a value determined by GMSK standard, the unwanted radiation is increased, causing an increase of an adjacent channel power leak ratio (ACPR). Reversely, in switching from a transmission operation time slot to another time slot, the intensity of an RF transmitter signal must be decreased at a descending rate determined by GMSK standard. The decrease of the RF transmitter signal intensity of this time is termed "ramp-down". When the descending rate of the ramp-down is larger than a value determined by GMSK standard, the unwanted radiation is increased, causing an increase of the adjacent channel power leak ratio (ACPR). The ramp voltages for the ramp-up and ramp-down are produced from digital ramp data from a baseband LSI.

On the on the hand, the intensity of an RF transmitter signal sent to the base station from the communications terminal device must be controlled in proportion to the communication distance between a communications terminal device such as a mobile phone terminal and a base station. The intensity of an RF transmitter signal at the time of completion of the rise of ramp-up is proportional to the communication distance between a communications terminal device and a base station. The voltage level of a ramp voltage produced by a baseband LSI at the time of completion of ramp-up is proportional to the communication distance. In addition, the intensity of an RF transmitter signal to the base station which has responded to the level of a ramp voltage from the baseband LSI is controlled according to an amplification factor of the RF power amplifier (PA). The amplification factor (gain) of the RF power amplifier (PA) can be controlled by an automatic power control voltage (Vapc).

As described above, in the polar loop system materializing the EDGE system, the phase modulation control loop (PM LP) and amplitude modulation control loop (AM LP) each include an RF power amplifier (PA) in each loop. In GMSK, RF power amplifiers (PA) are required to generate an RF power of several watts, and therefore RF power amplifiers (PA) each incorporate a power amplification transistor such as a power MOS with a large device size. As a result, the RF power amplifiers (PA) each have a large nonlinearity and a large phase delay, however phase information and amplitude information of RF transmitter signals produced by the RF power amplifiers (PA) are exact because the two loops include RF power amplifiers (PA) respectively.

On the other hand, for ramp-up and ramp-down in the EDGE transmission mode, the amplification factor of the RF power amplifier (PA) included in the amplitude modulation control loop (AM LP) must be controlled depending on the ramp voltages or digital ramp data. However, it is required to make compensation so that the level of a feedback signal of the amplitude modulation control loop (AM LP) is not changed even when the amplification factor of the RF power amplifier (PA) included in the amplitude modulation control loop (AM LP) is changed. The technique is becoming more sophisticated, and therefore the description thereof is to be continued with reference to the drawings.

FIG. 1 is a diagram showing a transmitter which has been examined by the inventors prior to the invention. The transmitter includes: a baseband LSI (BB); an RF communication semiconductor integrated circuit (RF IC); a power-amplifier module PAM; an analog front-end module FEM; and an antenna ANT for receive and transmission. To the baseband LSI (BB), an application processor (AP), a static random access memory (SRAM), a flash non-volatile memory (Flash) are connected through external buses. In the flash non-volatile memory Flash, various kinds of control programs and application software programs for the baseband LSI, application processor AP and RF IC are stored.

Various commands from the baseband LSI to the RF IC, transmission data, various pieces of control data are supplied to a digital RF interface 1 of the RF IC. An RF receive signal received through the antenna ANT for receive and transmission is supplied to a receive system (not shown) of the RF IC through the analog front-end module FEM, and converted down into an analog baseband receive signal. The analog baseband receive signal is converted by an analog-to-digital converter into a digital baseband receive signal, and supplied to the baseband LSI through the digital RF interface 1.

Also, a transmission digital baseband signal from the baseband LSI is supplied to the digital RF interface 1, and then to a digital modulator 2. The digital modulator core in the digital modulator 2 responds to the transmission digital baseband signal to produce orthogonal transmission digital baseband signals TxDBI and TxDBQ. Two digital-to-analog converters (DAC) in the digital modulator 2 each convert the orthogonal transmission digital baseband signals TxDBI and TxDBQ into orthogonal transmission analog baseband signals TxABI and TxABQ, and then supply the resultant analog signal to corresponding one of two mixers of a transmission mixer 3 respectively. The intermediate frequency local carrier signals for transmission supplied to the two mixers of the transmission mixer 3 are formed by dividing of an oscillation signal of an RF voltage control oscillator 4 by a 1/N frequency divider and a ½ frequency divider, and phase shift by a 90-degree phase shifter 5. The two intermediate frequency local carrier signals for transmission supplied to the two mixers of the transmission mixer 3 from the 90-degree phase shifter 5 have a 90-degree phase difference. Incidentally, the oscillation frequency of the RF voltage control oscillator 4 is set by an RF fractional PLL frequency synthesizer 6. Further, between an output of the RF voltage control oscillator 4 and an input of the 1/N frequency divider is connected a buffer amplifier BF3. An intermediate-frequency transmitter signal Vref is formed by vector synthesis from the output of an adder connected with outputs of the two mixers of the transmission mixer 3. The intermediate-frequency transmitter signal Vref is supplied to the phase modulation control loop PM LP and amplitude modulation control loop AM LP. In EDGE transmission mode the phase modulation control loop PM LP makes the phases of RF transmitter signals output from RF power amplifiers PA1 and PA2 of the power-amplifier module PAM follow the phase of the intermediate-frequency transmitter signal Vref. The amplitude modulation control loop AM LP makes the amplitudes of RF transmitter signals output from the RF power amplifiers PA1 and PA2 of the power-amplifier module PAM follow the amplitude of the intermediate-frequency transmitter signal Vref.

The phase modulation control loop PM LP includes a feed circuit constituted by a phase comparator PD, a low-pass filter LF1, a voltage control oscillator 7 for transmission, a switch SW4, a ½ frequency divider, a buffer amplifier BF2, driver amplifiers DR1 and DR2 and a power-amplifier module PAM. The phase modulation control loop PM LP further includes a back circuit constituted by couplers Cp11 and Cp12, attenuators ATT1 and ATT2, a buffer amplifier BF1, a switch SW1, a down-conversion mixer DCM, and switches SW2 and SW3. The feed circuit and the back circuit form a feedback. In EDGE transmission mode, an RF component of an RF transmitter signal from the power-amplifier module PAM is supplied to one input terminal of the down-conversion mixer DCM through the couplers Cp11 and Cp12, the attenuators ATT1 and ATT2, the buffer amplifier BF1, and the switch SW1. In GMSK transmission mode, an RF component coming from the output of the voltage control oscillator 7 for transmission or the output of the ½ frequency divider is supplied to the one input terminal of the down-conversion mixer DCM through the buffer amplifier BF2 and the switch SW1. To the other input terminal of the mixer DCM, an oscillation signal from the RF voltage control oscillator 4 is supplied through two ½ frequency dividers and a switch SW6. As a result, an intermediate frequency amplitude feedback signal having the same phase and frequency as the phase and frequency of the intermediate-frequency transmitter signal Vref supplied to one input terminal of the phase comparator PD from the transmission mixer 3 is produced from the output of the mixer DCM. In EDGE transmission mode, the intermediate frequency amplitude feedback signal produced from the output of the mixer DCM will be supplied to the other input terminal of the phase comparator PD through the switch SW2, a first variable amplifier MVGA and the switch SW3. In GMSK transmission mode, the intermediate frequency amplitude feedback signal produced from the output of the mixer DCM is supplied to the other input terminal of the phase comparator PD through the switches SW2 and SW3.

The amplitude modulation control loop AM LP includes a feed circuit constituted by an amplitude comparator AMD, a low-pass filter LF2, a second variable amplifier IVGA, a voltage-current converter VIC, a switch SW5, a level converter LVC and a power-amplifier module PAM. The amplitude modulation control loop AM LP further includes a back circuit constituted by the couplers Cp11 and Cp12, the attenuators ATT1 and ATT2, the buffer amplifier BF1, the switch SW1, the down-conversion mixer DCM, the switch SW2 and the first variable amplifier MVGA. The feed circuit and the back circuit form a feedback. An RF component of an RF transmitter signal from the power-amplifier module PAM is supplied to the one input terminal of the down-conversion mixer DCM. To the other input terminal of the mixer DCM, the oscillation signal from the RF voltage control oscillator 4 is supplied through the two ½ frequency dividers and the switch SW6. As a result, an intermediate frequency amplitude feedback signal having the same amplitude as that of the intermediate-frequency transmitter signal Vref supplied to one input terminal of the amplitude comparator AMD from the transmission mixer 3 will be produced from the output of the first variable amplifier MVGA and supplied to the other input terminal of the amplitude comparator AMD. In GMSK transmission mode, the output of a voltage-current converter VID is supplied to an input of the level converter LVC of the feed circuit through the switch SW5. To one input terminal of the voltage-current converter VID is supplied an analog ramp voltage Vramp from a ramp digital-to-analog converter 8; to the other input terminal of the voltage-current converter VID is supplied the output of the level converter LVC. Therefore, in the GMSK transmission mode, the output of the level converter LVC supplied to the power-amplifier module PAM is substantially identical to the analog ramp voltage Vramp from the ramp digital-to-analog converter 8.

Now, it is noted that in the EDGE transmission mode, the back circuit of the phase modulation control loop PM LP and the back circuit of the amplitude modulation control loop AM LP share the couplers Cp11 and Cp12, the attenuators ATT1 and ATT2, the buffer amplifier BF1, the switch SW1, the down-conversion mixer DCM, the switch SW2 and the first variable amplifier MVGA.

Also, an RF transmitter signal TxGSM850 of GSM850 substantially near 0.8 GHz and an RF transmitter signal TxGSM900 of GSM900 substantially near 0.9 GHz are produced from the output of the power amplifier PA1. An RF transmitter signal TxDCS1800 of DCS1800 near about 1.8 GHz and an RF transmitter signal TxPCS1900 of PCS1900 near about 1.9 GHz are produced from the output of the power amplifier PA2.

Before the description with reference to FIG. 1, it has been described that ramp-up and ramp-down in the EDGE transmission mode need control of the amplification factor of an RF power amplifier included in an amplitude modulation control loop AM LP in response to a ramp voltage or digital ramp data. Also, it has been described that compensation must be made so that the level of a feedback signal of the amplitude modulation control loop AM LP is not changed even when the amplification factor of the RF power amplifier included in the amplitude modulation control loop AM LP is changed.

The two things can be materialized by controlling the gain of the first variable amplifier MVGA of the back circuit in the amplitude modulation control loop AM LP in inverse proportion to the digital ramp data. Specifically, in ramp-up, digital ramp data is increased in order to increase the intensity of an RF transmitter signal, which is the output of the RF power amplifier. Then, the gain of the first variable amplifier MVGA of the back circuit in the amplitude modulation control loop AM LP is lowered. However, it is required to maintain the level of a feedback signal produced from the output of the first variable amplifier MVGA and supplied to the other input terminal of the amplitude comparator AMD at the level of the signal Vref supplied to the one input terminal of the amplitude comparator AMD from the transmission mixer 3 without lowering the level of the feedback signal. To do so, it suffices to increase the amplification factor of the RF power amplifier in a direction reverse to that of lowering of the gain of the first variable amplifier MVGA by a quantity equal to the absolute value of the quantity of the lowering. This enables the ramp-up and ramp-down in the EDGE transmission mode, and therefore exact amplitude modulation in the EDGE transmission mode can be achieved.

On the other hand, the gain of the second variable amplifier IVGA of the feed circuit in the amplitude modulation control loop AM LP is controlled in direct proportion to digital ramp data. Consequently, even when the digital ramp data is changed, the sum of the gains of the first and second variable amplifiers MVGA and IVGA becomes substantially constant. As a result, the effect of the increase in the digital ramp data making remarkably smaller the phase margin of open-loop frequency characteristics of the amplitude modulation control loop AM LP is reduced.

Meanwhile, as it has been becoming ubiquitous to use a digital interface between an RF IC and a baseband LSI, a transmission baseband signal, a receive baseband signal and a ramp voltage between them have been also changed from analog signals to digital ones. Hence, the digital-to-analog converter incorporated in the RF IC converts a digital signal like this into an analog signal and supplies the resultant signal to a circuit inside the RF IC. In the analog interface age before digital interfaces, digital ramp data produced in a baseband LSI had been converted to analog ramp voltages by a built-in ramp digital-to-analog converter (RampDAC) of a baseband LSI. Therefore, an analog ramp voltage from the built-in ramp digital-to-analog converter of the baseband LSI had been supplied to an RF IC through a conductor line of a circuit board outside a chip. The analog ramp voltage was formed by a linearizer circuit provided in the RF IC to control gains of the first and second variable amplifiers MVGA and IVGA, thereby materializing a continuously changing gain. When the gain control is performed continuously in this way, no switching noise arises when the gains of the RF power amplifiers PA1 and PA2 are changed.

On the other hand, with widespread use of digital interfaces, ramp digital-to-analog converters (RampDAC) for converting digital ramp data to analog ramp voltages ended up being relocated to the inside of RF ICs from the inside of baseband LSIs together with other digital-to-analog converters and analog-to-digital converters. However, to control the gains of the first and second variable amplifiers MVGA and IVGA by use of a conventional analog ramp voltage, it is required to incorporate a linearizer circuit in an RF IC. This is unfavorable in terms of the cost and performance when considering of the area of an RF IC chip and the electric current consumption thereof. Hence, a gain variable amplifier of a digital type has been adopted, which uses not an analog ramp voltage having undergone the processing by a ramp digital-to-analog converter, but a digital control signal resulting from decode of digital ramp data for control of the gains of the first and second variable amplifiers MVGA and IVGA.

In GMSK transmission mode of the RF IC of the transmitter of FIG. 1, the change in the analog ramp voltage Vramp, which is an output of the ramp digital-to-analog converter 8 incorporated in the RF IC is sharp. Such sharp change in the analog ramp voltage Vramp is supplied to the power-amplifier module PAM through the voltage-current converter VID, the switch SW5 and the level converter LVC. A voltage converter LDO of the power-amplifier module PAM responds to a sharp change of the analog ramp voltage Vramp to produce an automatic power control voltage Vapc having a relatively sharp change. However, the RF power amplifiers PA1 and PA2 of the power-amplifier module PAM are controlled continuously with an analog ramp voltage, and therefore the switching noise owing to the switching of circuits inside the RF IC or the like is not generated. Thus, as for the RF power amplifiers PA1 and PA2, the changes in gains of the RF power amplifiers PA1 and PA2 never cause the change in the intensity of the RF transmitter signal at a rate over the rate of GMSK standard in the GMSK transmission mode even when the automatic power control voltage Vapc is changed relatively sharply.

The ramp control in the EDGE transmission mode of the RF IC of the transmitter of FIG. 1 is achieved by controlling the gain of the first variable amplifier MVGA of the back circuit of the amplitude modulation control loop AM LP in inverse proportion to digital ramp data. Specifically, in ramp-up, digital ramp data is increased in order to increase the intensity of an RF transmitter signal, which is the output of the RF power amplifier. Then, the gain of the first variable amplifier MVGA of the back circuit in the amplitude modulation control loop AM LP is lowered. However, it is required to maintain the level of a feedback signal produced from the output of the first variable amplifier MVGA and supplied to the other input terminal of the amplitude comparator AMD at the level of the signal Vref supplied to the one input terminal of the amplitude comparator AMD from the transmission mixer 3 without lowering the level of the feedback signal. To do so, it suffices to increase the amplification factor of the RF power amplifier in a direction reverse to that of lowering of the gain of the first variable amplifier MVGA by a quantity equal to the absolute value of the quantity of the lowering. Hence, for the purpose of reducing the area of the RF IC chip and lowering the power consumption thereof, the first and second variable amplifiers MVGA and IVGA are constituted by two or more differential amplifiers and others; the differential amplifiers are controlled to be activated or deactivated according to the settings of their gains. However, as a result of this arrangement, it has been revealed that when the gains of the amplifiers are switched with a minimum gain change width (e.g. 0.2 dB) at a high speed, switching noise is caused, and the intensity of the RF transmitter signal is changed at a rate over the rate of GMSK standard.

Further, the inventors found that in the EDGE transmission mode, the intensity of the RF transmitter signal was changed at a rate over the rate of GMSK standard for another cause.

The cause is the error of the change in gain of the first variable amplifier MVGA of the back circuit of the amplitude modulation control loop AM LP resulting from the manufacturing error of a semiconductor chip in association with the RF IC. In other words, the cause was that the manufacturing error of a semiconductor chip in association with the RF IC makes uneven the quantity of the change in gain of the first variable amplifier MVGA of the amplitude modulation control loop AM LP depending on the step of the change in digital ramp data.

FIG. 2 is a diagram showing a structure of the first variable amplifier MVGA of the amplitude modulation control loop AM LP of the RF IC of the transmitter shown in FIG. 1.

The first variable amplifier MVGA includes a first amplifier AMP1, a second amplifier AMP2 and a third amplifier AMP3, which are connected dependently. The gain-controllable range of the first amplifier AMP1 is between 6 and 30 dB, that of the second amplifier AMP2 is between 0 and 26 dB, and that of the third amplifier AMP3 is between −2 and 0 dB. The width of change of gain of the first and second amplifiers AMP1 and AMP2 is 2 dB/step, and the width of change of gain of the third amplifier AMP3 is 0.2 dB/step.

When eight-bit digital ramp data MVGA_IN [7:0] input to the controller MVGA Gain Cont is decoded, three sets of digital data for setting the gains of the first, second and third amplifiers AMP1, AMP2 and AMP3 are created.

Thirteen bits of the first set of digital data are used to individually activate or deactivate thirteen parallel amplifiers included in the first amplifier AMP1. Fourteen bits of the second set of digital data are used to individually activate or deactivate fourteen parallel amplifiers included in the second amplifier AMP2. Eleven bits of the third set of digital data are used to individually activate or deactivate eleven parallel amplifiers included in the third amplifier AMP3. To an output of the third amplifier AMP3 is connected a low-pass filter LPF which reduces harmonics of an intermediate-frequency feedback signal with a frequency of about 80 MHz to be supplied to the amplitude comparator AMD when the feedback signal goes through.

Also, to the controller MVGA Gain Cont, a clock signal CLK of 26 MHz and a reset signal RST for resetting eight-bit digital ramp data MVGA_IN [7:0] are supplied from the digital RF interface 1.

FIGS. 3A and 3B are plots each showing quantities of change of gain of the first variable amplifier MVGA in response to the change step according to the eight-bit digital ramp data MVGA_IN [7:0] supplied to the controller MVGA Gain Cont as in FIG. 2.

FIG. 3A shows an ideal condition that involves no error in manufacture of a RF IC semiconductor chip. In the case of FIG. 3A, the quantities of change of gain of the first variable amplifier MVGA in response to the minimum change step according to the eight-bit digital ramp data MVGA_IN [7:0] become a uniform value of 0.2 dB.

In contrast, FIG. 3B shows a practical condition that involves an error in manufacture of a RF IC semiconductor chip. In the case of FIG. 3B, the most of the quantities of change of gain of the first variable amplifier MVGA in response to the minimum change step according to the eight-bit digital ramp data MVGA_IN [7:0] is distributed between 0.17 and 0.23 dB. However, there are quite a few points showing a gain change quantity of 0.25 dB, and one of them shows a remarkably large quantity of the change as large as 0.32 dB.

Therefore, the case where an operation of ramp-up is performed in a practical condition that involves an error in manufacture of a RF IC semiconductor chip as described with reference to FIG. 3B is assumed, for example. Even when the eight-bit digital ramp data MVGA_IN [7:0] is increased by the minimum change step at a fixed rate, there arises a point where an error largely decreases the gain of the first variable amplifier MVGA. At this point, the intensity of the RF transmitter signal from the power amplifier ends up being increased largely over the set gain. In contrast, in the case of ramp-down, even when the eight-bit digital ramp data MVGA_IN [7:0] is decreased by the minimum change step at a fixed rate, there arises a point where an error largely increases the gain of the first variable amplifier MVGA. At this point, the intensity of the RF transmitter signal form the power amplifier ends up being decreased largely over the set gain. As a result, unwanted radiation is increased, and thus the adjacent channel power leak ratio (ACPR) is increased.

The invention was made as a result of examination made by the inventors prior to the present invention as described above. Therefore, it is an object of the invention to lower the level of unwanted radiation in ramp-up of an RF transmitter signal of the RF power amplifier, which is supplied to an antenna. Also, it is another object of the invention to lower the level of unwanted radiation in ramp-down of the RF transmitter signal of the RF power amplifier supplied to the antenna.

The above and other objects of the invention and novel features hereof will be apparent from the description hereof and the accompanying drawings.

Of the embodiments disclosed herein, the preferred ones will be described below in brief.

That is, as to a transmitter according to a preferred embodiment of the invention, an internal operation in the transmitter is adjusted so that the level of the RF transmitter signal of the RF power amplifier supplied to the antenna is substantially stopped from rising, or made to descend in course of ramp-up of the RF transmitter signal. In regard to a transmitter according to another preferred embodiment of the invention, an internal operation in the transmitter is adjusted so that the level of the RF transmitter signal of the RF power amplifier supplied to the antenna is substantially stopped from going down, or made to ascend in course of ramp-down of the RF transmitter signal.

DETAILED DESCRIPTION OF THE PREFERRED EMBODIMENTS

1. Summary of the Preferred Embodiments

Figure 1:
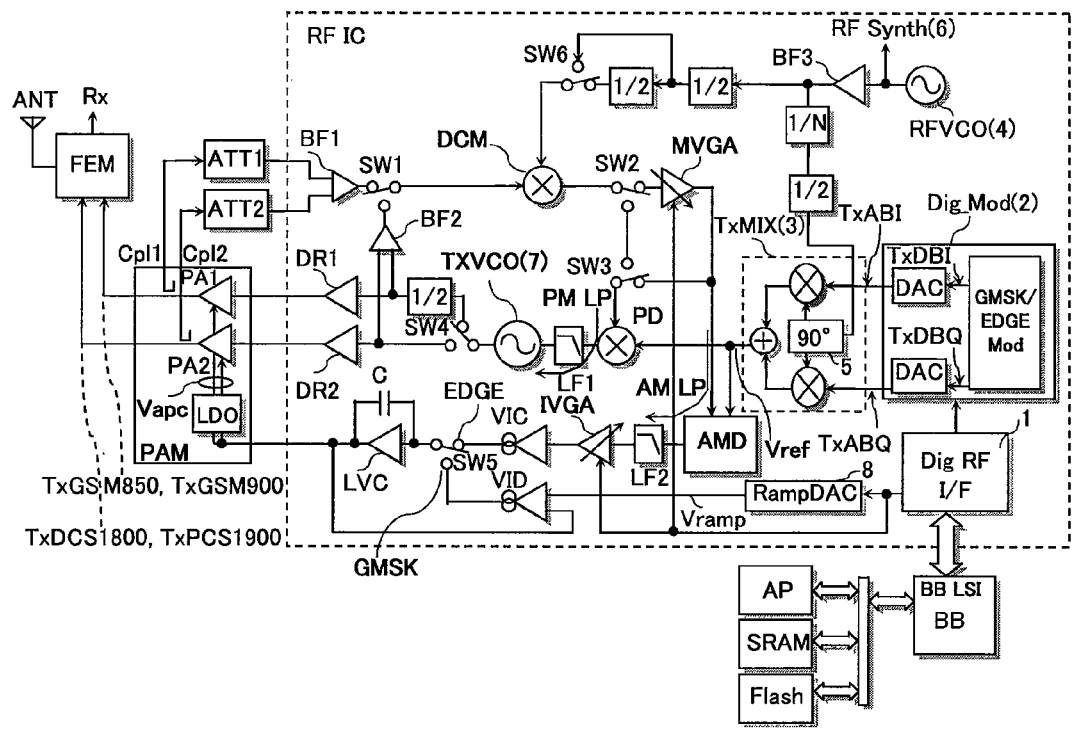
FIG. 1 is a diagram showing a transmitter which has been examined by the inventors prior to the invention, however it is identical in basic structure to a transmitter according to an embodiment of the invention.

First, the summary of the preferred embodiments of the invention disclosed herein will be described. In the description of Summary of the preferred embodiments, reference characters and signs to refer to the drawings, which are accompanied with paired round brackets, just exemplify what the concepts of components referred to by the characters and signs contain.

[1] A transmitter according to a preferred embodiment of the invention includes RF power amplifiers (PA1, PA2) which produce an RF transmitter signal to be supplied to an antenna, and an RF transmitter signal-processing circuit (RF IC) which converts up a baseband transmitter signal thereby to produce an RF transmitter input signal to be supplied to the RF power amplifier.

An internal operation of the RF transmitter signal-processing circuit is adjusted so that the level of the RF transmitter signal is substantially stopped from rising, or made to descend in course of ramp-up of the RF transmitter signal.

In the transmitter according to a preferable form, an internal operation of the RF transmitter signal-processing circuit is adjusted so that the level of the RF transmitter signal is substantially stopped from going down, or made to ascend in course of ramp-down of the RF transmitter signal.

Figure 5:
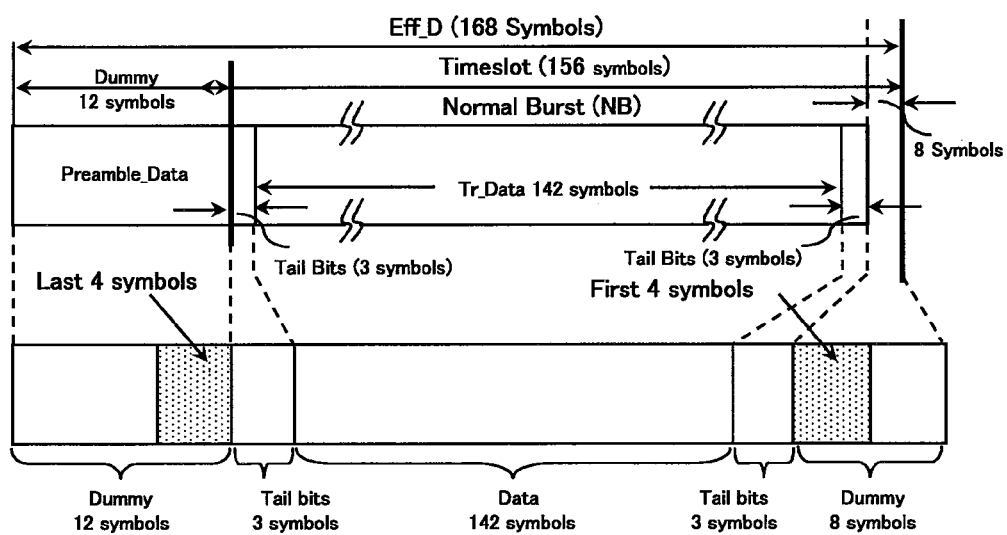
FIG. 5 is an illustration of assistance in explaining the detail of effective data of transmission data of the operation sequence shown with reference to FIG. 4.
Figure 6:
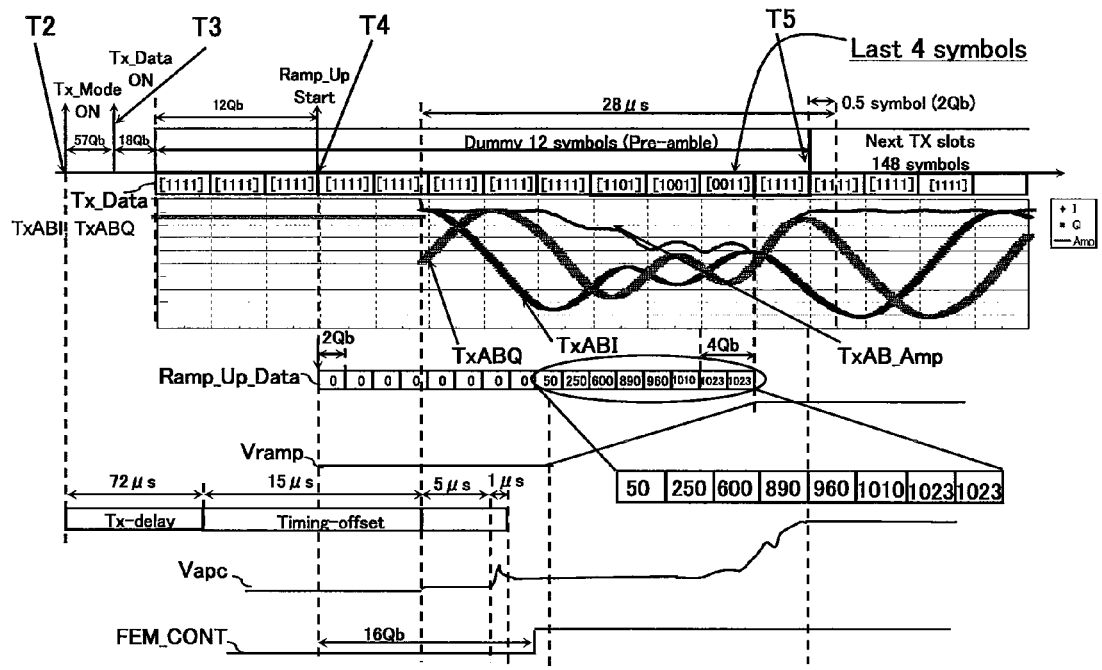
FIG. 6 is a time chart of assistance in explaining details of an operation sequence before and after an elapse of the setting time during the time of ramp-up in the EDGE transmission mode shown in FIG. 4.
Figure 7:
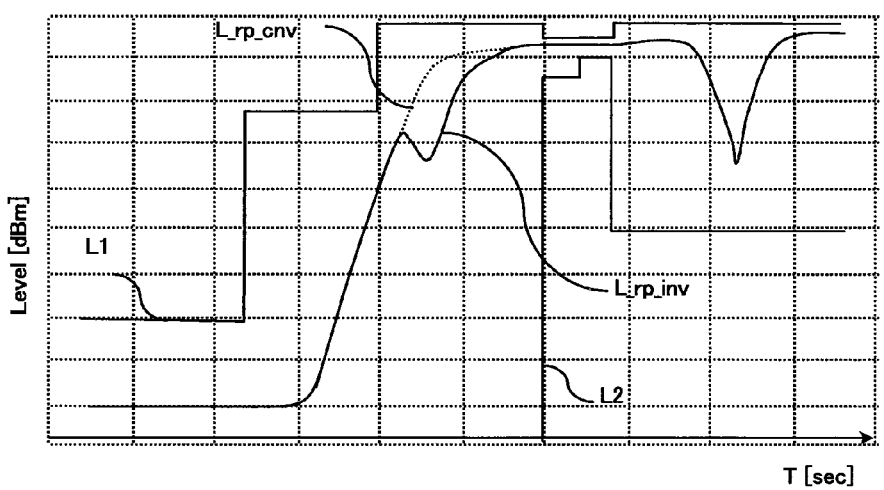
FIG. 7 is a plot of assistance in explaining the effect of the reduction in unwanted radiation by the ramp-up operation sequence of the transmitter according to the embodiment of the invention shown in FIG. 1 in the EDGE transmission mode.

In the transmitter according to a more preferable form, adjustment of the internal operation of the RF transmitter signal-processing circuit in course of ramp-up is enabled by ramp-up adjustment data (Last 4 symbols) contained in preamble data (Preamble_Data) precedent to real transmission data (Tr_Data) to be transmitted after completion of the ramp-up (see FIGS. 5, 6 and 7).

In an example, the ramp-up adjustment data and the real transmission data are supplied from a baseband processing unit (BB LSI).

Figure 8:
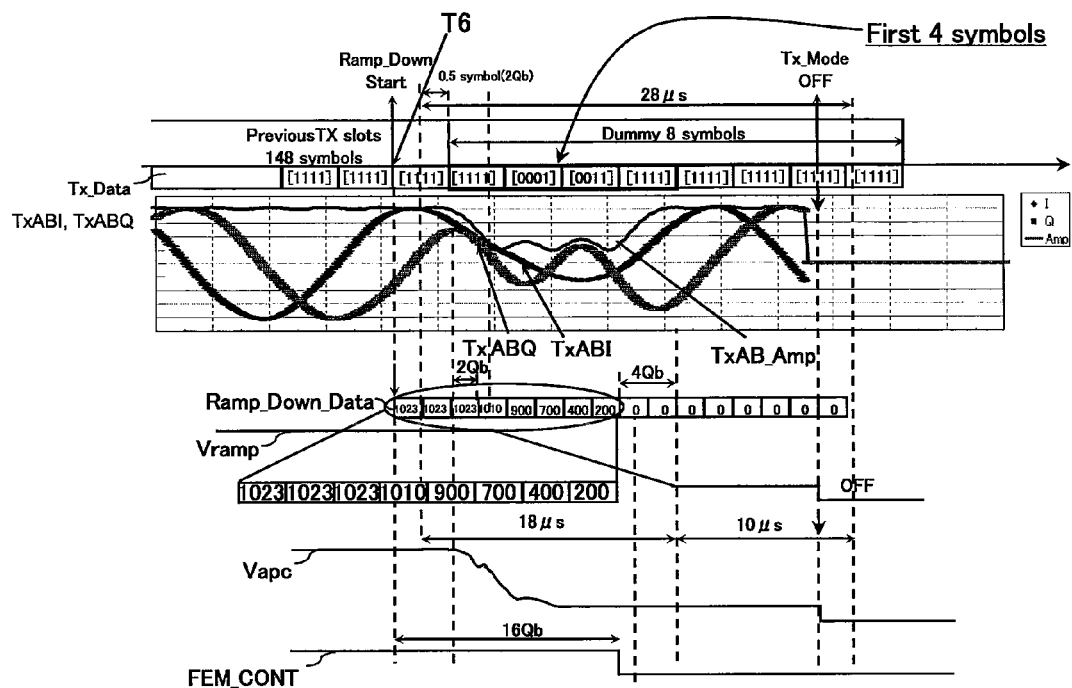
FIG. 8 is a time chart of assistance in explaining details of an operation sequence in ramp-down in the EDGE transmission mode shown in FIG. 4.
Figure 9:
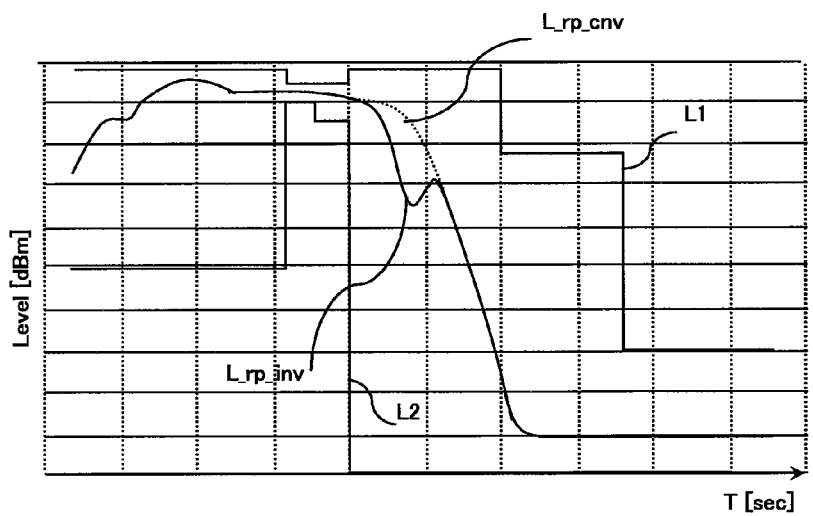
FIG. 9 is a plot of assistance in explaining the effect of the reduction in unwanted radiation by the ramp-down operation sequence of the transmitter according to the embodiment of the invention shown in FIG. 1 in the EDGE transmission mode.

In the transmitter according to a more preferable form, adjustment of the internal operation of the RF transmitter signal-processing circuit in course of ramp-down is enabled by ramp-down adjustment data (First 4 symbols) contained in dummy data (Dummy 8 symbols) added to the real transmission data (see FIGS. 5, 8 and 9).

In another example, the ramp-down adjustment data is also supplied from the baseband processing unit.

In the transmitter according to a specific form, the RF transmitter signal-processing circuit includes a phase modulation control loop (PM LP) and an amplitude modulation control loop (AM LP), which produce the RF transmitter input signal through phase modulation and amplitude modulation respectively. The amplitude modulation control loop includes a first variable amplifier (MVGA) in its loop; the gain of the first variable amplifier is changed according to ramp information (Ramp_Up Data, Ramp_Down Data) for the ramp-up and ramp-down. Thus, the ramp-up and ramp-down are enabled by controlling the gain of the first variable amplifier according to the ramp information.

In the transmitter according to a more specific form, the amplitude modulation control loop includes a second variable amplifier (IVGA) in its loop; the gain of the second variable amplifier is changed in a direction reverse to that of the change of the gain of the first variable amplifier in response to the ramp information.

In the transmitter according to the most specific form, the amplitude modulation control loop constitutes one of a polar loop for EDGE transmission and a polar modulator.

[2] An RF transmitter signal-processing circuit (RF IC) according to another aspect is arranged so as to be connected with RF power amplifiers (PA1, PA2) which produce an RF transmitter signal to be supplied to the antenna of the transmitter.

The RF transmitter signal-processing circuit converts up the baseband transmitter signal thereby to produce an RF transmitter input signal to be supplied to the RF power amplifier.

An internal operation of the RF transmitter signal-processing circuit is adjusted so that the level of the RF transmitter signal is substantially stopped from rising, or made to descend in course of ramp-up of the RF transmitter signal.

[3] An method for operating the transmitter according to another aspect includes a preparation step of preparing RF power amplifiers (PA1, PA2) which produce an RF transmitter signal to be supplied to the antenna, and an RF transmitter signal-processing circuit (RF IC) which converts up a baseband transmitter signal thereby to produce an RF transmitter input signal to be supplied to the RF power amplifier.

The operating method includes a ramp-up adjustment step of adjusting an internal operation of the RF transmitter signal-processing circuit so that the level of the RF transmitter signal is substantially stopped from rising, or made to descend in course of ramp-up of the RF transmitter signal.

The operating method includes a ramp-up step of making the RF transmitter signal ramp up after the ramp-up adjustment step.

The operating method according to a preferable form includes a ramp-down adjustment step of adjusting an internal operation of the RF transmitter signal-processing circuit so that the level of the RF transmitter signal is substantially stopped from going down, or made to ascend in course of ramp-down of the RF transmitter signal.

The operating method includes a ramp-down step of making the RF transmitter signal ramp down after the ramp-down adjustment step.

In the operating method according to a preferable form, the ramp-up adjustment step, the ramp-up step, the ramp-down adjustment step, and the ramp-down step are controlled by software programs stored in a non-volatile storage device contained in the transmitter.

2. Further Detailed Description of the Preferred Embodiments

Next, the embodiments will be described further in detail. The detailed description of the best mode of carrying out the invention will be presented below with reference to the drawings. In all the drawings to which reference is made in describing the best mode of carrying out the invention, the members having a common function are identified by a common reference character or sign, and the description thereof is skipped herein.

<<Configuration of the Transmitter>>

Figure 2:
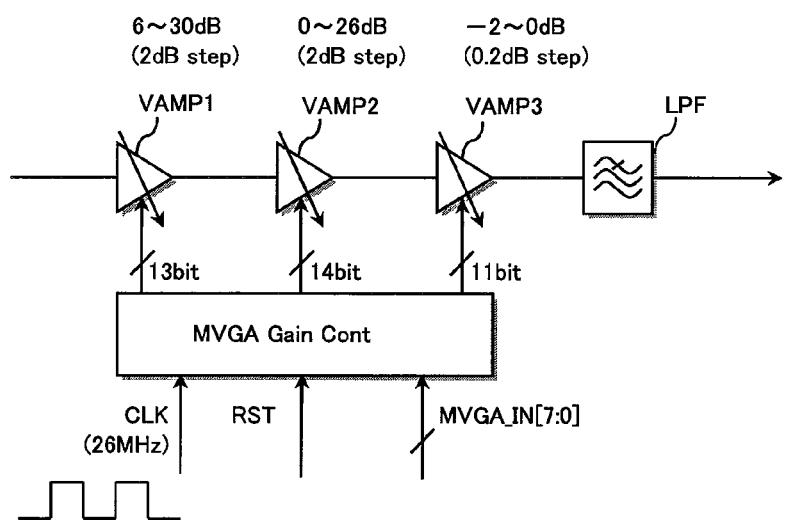
FIG. 2 is a diagram showing a structure of a first variable amplifier of an amplitude modulation control loop of an RF IC of the transmitter shown in FIG. 1.
Figure 3A:
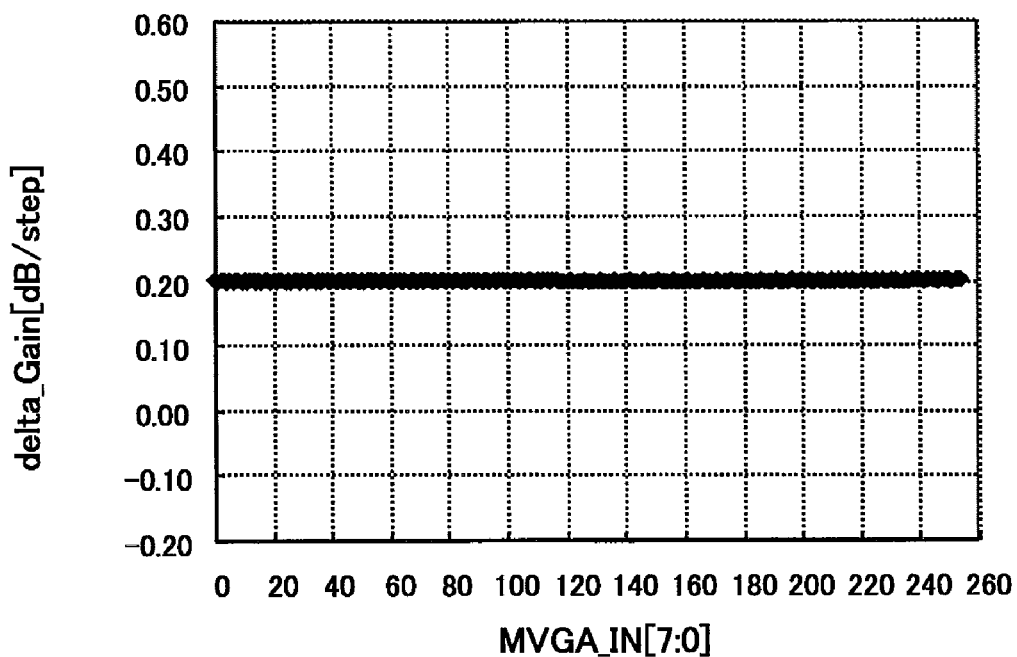
FIGS. 3A and 3B are plots each showing quantities of change of gain of the first variable amplifier in response to the change step according to digital ramp data supplied to the controller as shown in FIG. 2.
Figure 3B:
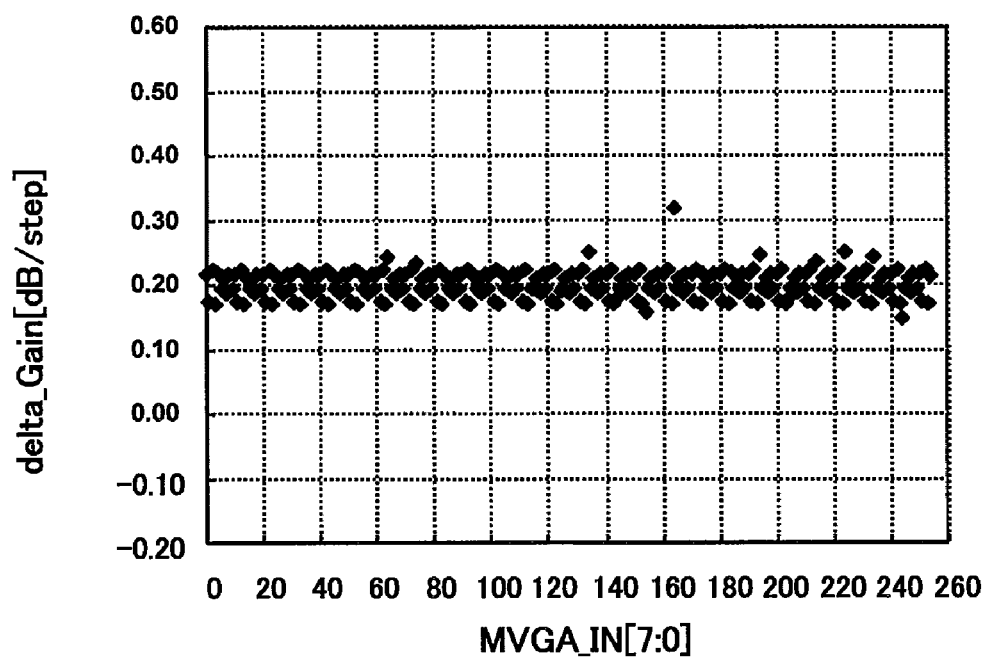

FIG. 1 is a diagram showing a transmitter according to an embodiment of the invention. FIG. 2 is a diagram showing a structure of a first variable amplifier MVGA of an amplitude modulation control loop AM LP of an RF IC of the transmitter shown in FIG. 1.

The transmitter shown in FIG. 1 has no large difference in appearance from a transmitter, which had been examined prior to the invention. However, the transmitter in association with the invention differs from the conventional one in function.

Specifically, in the transmitter according to the embodiment of the invention shown in FIG. 1, an internal operation in the transmitter is adjusted so that the level of the RF transmitter signal is substantially stopped from rising, or made to descend in course of ramp-up of the RF transmitter signal of the RF power amplifier to be supplied to the antenna. The waveform illustration of FIG. 7 shows a way of the level down of the RF transmitter signal in course of ramp-up. According to a specific embodiment, adjustment of the internal operation can be made by a digital baseband transmitter signal produced by the baseband LSI.

Further, in the transmitter according to the embodiment of the invention shown in FIG. 1, an internal operation in the transmitter is adjusted so that the level of the RF transmitter signal is substantially stopped from going down, or made to ascend in course of ramp-down of the RF transmitter signal of the RF power amplifier to be supplied to the antenna. The waveform illustration of FIG. 9 shows a way of the rise of the level in course of ramp-down of the RF transmitter signal. According to the specific embodiment, adjustment of the internal operation can be made by a digital baseband transmitter signal produced by the baseband LSI.

<<Transmission Operation by the Transmitter in Edge Transmission Mode>>

Figure 4:
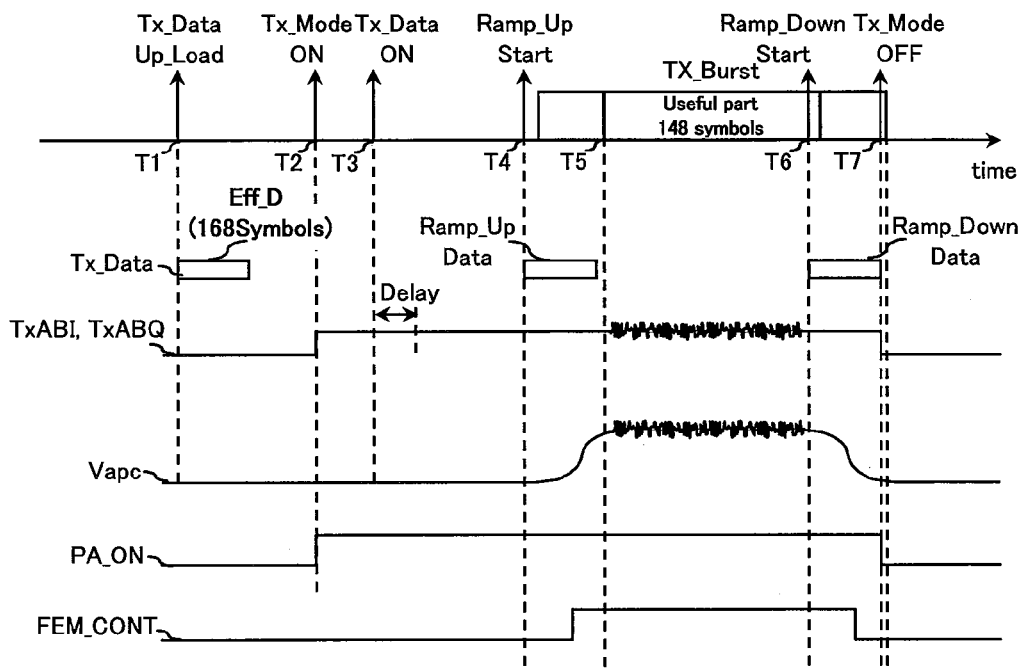
FIG. 4 is a time chart of assistance in explaining an operation sequence of the transmitter according to the embodiment of the invention shown in FIG. 1 in the EDGE transmission mode.

FIG. 4 is a time chart of assistance in explaining an operation sequence of the transmitter according to the embodiment of the invention shown in FIG. 1 in the EDGE transmission mode.

<<Transmission Data Upload Command>>

Now, reference is made to FIG. 4. At the time T1 a transmission data upload command Tx_data Up_Load is transferred to the RF IC from the baseband LSI, and transmission data Tx_Data of the digital baseband transmitter signal is also transferred. The transmission data Tx_Data is effective data Eff_D of 168 symbols, and held in a built-in RAM of the digital RF interface 1 of the RF IC or an internal memory such as a data register thereof. The detail of effective data Eff_D of 168 symbols of transmission data Tx_Data transferred at the time T1 is shown in FIG. 5.

<<Effective Data of Transmission Data>>

FIG. 5 is an illustration showing the detail of 168 symbols of effective data Eff_D of transmission data Tx_Data transferred in the form of a normal burst from the baseband LSI to the RF IC. The 168 symbols of effective data Eff_D are composed of twelve symbols of dummy (preamble data) and 156 symbols of time slot (normal burst). In this embodiment of the invention, particularly the last four symbols of the twelve symbols of dummy (preamble data) contain control data for reduction in unwanted radiation important for ramp-up. Incidentally, the 156 symbols of time slot (normal burst) contain a tail bit of the first three symbols and a tail bit of the last three symbols, and 142 symbols of transfer data Tr_Data between them, which can be utilized in actual transmission. Further, in this embodiment of the invention, the first four symbols of the last-added eight symbols of dummy of the 168 symbols of effective data Eff_D contain control data for reduction in unwanted radiation important for ramp-down. In addition, the 142 symbols of transfer data Tr_Data located halfway contain a digital baseband transmitter signal.

In GSM data communication, one symbol of a transmission-and-receive baseband signal consists of four bits. When the last fourth bit of a symbol is "1", the signal is a piece of EDGE transmission data, and the first three bits show an amplitude according to AM modulation. When the last fourth bit of a symbol is "0", the signal is a piece of GMSK transmission data, which only phase modulation is applied to. The first three bits of such data are, for example, all "1", i.e. "111", and in that case, the signal is fixed in amplitude. In addition, in GSM data communication, of four bits of a symbol, one bit is termed a quarter bit. Further, in the case of using a system clock frequency of 26 MHz, one quarter bit (1 Qb) shows a time of 923.08 nanoseconds.

<<EDGE Transmission Mode>>

When the RF IC of the transmitter according to the embodiment of the invention shown in FIG. 1 responds to the setting of RF IC operation mode transferred from the baseband LSI to bring the transmitter into EDGE transmission mode, the feed circuit of the amplitude modulation control loop AM LP is activated to feed amplitude modulation information. Now, it is noted that the feed circuit of the amplitude modulation control loop AM LP includes the amplitude comparator AMD, the low-pass filter LF2, the second variable amplifier IVGA, the voltage-current converter VIC, the switch SW5, the level converter LVC, and the power-amplifier module PAM. Also, the back circuit of the amplitude modulation control loop AM LP is activated to back the amplitude modulation information. Now, it is noted that the back circuit of the amplitude modulation control loop AM LP includes the couplers Cp11 and Cp12, the attenuators ATT1 and ATT2, the buffer amplifier BF1, the switch SW1, the down-conversion mixer DCM, the switch SW2, and the first variable amplifier MVGA. As a matter of course, the feed and back circuits of the phase modulation control loop PM LP are activated to feed and back phase modulation information respectively. Now, it is noted that the feed circuit of the phase modulation control loop PM LP includes the phase comparator PD, the low-pass filter LF1, the voltage control oscillator 7 for transmission, the switch SW4, the ½ frequency divider, the buffer amplifier BF2, the driver amplifiers DR1 and DR2 and the power-amplifier module PAM. Further, the back circuit of the phase modulation control loop PM LP includes the couplers Cp11 and Cp12, the attenuators ATT1 and ATT2, the buffer amplifier BF1, the switch SW1, the down-conversion mixer DCM, the switches SW2 and SW3, and the first variable amplifier MVGA.

<<GMSK Transmission Mode>>

When the RF IC of the transmitter according to the embodiment of the invention shown in FIG. 1 responds to the setting of RF IC operation mode transferred from the baseband LSI to bring the transmitter into GMSK transmission mode, in which only phase modulation is used, the feed and back circuits of the phase modulation control loop PM LP are activated to feed and back phase modulation information respectively. In contrast, in the GMSK transmission mode, the amplitude modulation is not performed, and therefore the feed and back circuits of the amplitude modulation control loop AM LP are deactivated. Thus, in the GMSK transmission mode, the power consumption of the feed and back circuits of the amplitude modulation control loop AM LP can be trimmed down.

<<Transmission Mode On Command>>

Reference is made to FIG. 4. At the time T2 a transmission mode on command Tx_Mode ON is transferred from the baseband LSI to the RF IC. Then, operations of the digital modulator 2, transmission mixer 3, RF voltage control oscillator 4, RF frequency synthesizer 6, voltage control oscillator 7 for transmission, and two modulation control loops PM LP and AM LP are started. The analog baseband transmitter signals TxABI and TxABQ from the two digital-to-analog converters DAC of the digital modulator 2 are raised to a predetermined DC voltage level shown by a waveform in FIG. 4. The predetermined DC voltage level of the analog baseband transmitter signals TxABI and TxABQ can be used for calibration of the DC offset cancel of paths between outputs of the digital-to-analog converters DAC of the RF IC and inputs of the transmission mixer 3. In addition, a power amplifier activation signal PA_ON for starting supply of source and bias voltages to the RF power amplifiers PA1 and PA2 of the power-amplifier module PAM is also changed from Low level to High level.

<<Transmission Data Internal Transfer Command>>

Again, reference is made to FIG. 4. At the time T3 a transmission data internal transfer command Tx_Data ON is transferred to the RF IC from the baseband LSI. When a predetermined delay time Delay has elapsed from the time T3, readout of 168 symbols of effective data Eff_D of transmission data Tx_Data held by an internal memory such as a RAM or data register incorporated in the RF IC is started. However, until a setting time, which is to be described later, has elapsed, the analog baseband signals TxABI and TxABQ corresponding to the DC voltage are supplied. After the setting time has elapsed, analog baseband signals TxABI and TxABQ corresponding to the symbols are supplied. That is, as to eight symbols contained in twelve symbols (preamble data) before last four symbols of a dummy, four bits of each symbol are arranged to be all "1", namely "1111". This means that the value of amplitude resulting from AM modulation is an RMS value with a large constant amplitude in the EDGE transmission mode. Now, it is noted that RMS is the abbreviation which stands for "Root Mean Square". Thus, a digital baseband transmitter signal corresponding to the RMS amplitude value is read out from an internal memory such as a built-in RAM or data register of the digital RF interface 1 of the RF IC, and supplied to the digital modulator 2. The digital modulator 2 produces orthogonal digital baseband transmitter signals TxDBI and TxDBQI. Then, orthogonal analog baseband transmitter signals TxABI and TxABQ corresponding to the direct voltages are produced by the digital-to-analog converters, and supplied to the transmission mixer 3. Thus, supply of the intermediate-frequency transmitter signal Vref corresponding to the RMS value with a large constant amplitude to inputs of the phase modulation control loop PM LP and amplitude modulation control loop AM LP of the RF IC is started.

<<Ramp-Up Start Command>>

Now, reference is made to FIG. 4. At the time T4 a ramp-up start command Ramp_Up Start is transferred to the RF IF from the baseband LSI. Then, load of digital ramp data Ramp_Up Data for ramp-up into an internal memory such as a built-in RAM or data register of the RF IC from the baseband LSI is started. Therefore, as the digital value of the loaded digital ramp data Ramp_Up Data is increased, the gain of the first variable amplifier MVGA of the amplitude modulation control loop AM LP of the RF IC is lowered. Reversely to this, the level of the automatic power control voltage Vapc is raised, and the amplification factors of the RF power amplifiers PA1 and PA2 of the power-amplifier module PAM start increasing. When the rise in the level of the automatic power control voltage Vapc is started, the level of a control signal FEM_CONT for activating the analog front-end module FEM is changed from Low to High. Then, supply of the RF transmitter signals to the antenna ANT from the RF power amplifiers PA1 and PA2 of the power-amplifier module PAM are started.

<<Level Down of Transmitter Signal in Course of Ramp-Up>>

When the setting time as mentioned above has elapsed in course of the increase in the amplification factors of the RF power amplifiers PA1 and PA2 of the power-amplifier module PAM, supply of analog baseband signals TxABI and TxABQ corresponding to the symbols is started. That is, readout of 168 symbols of effective data Eff_D as shown in FIG. 5 is executed. In this embodiment of the invention, of twelve symbols of dummy, particularly the last four symbols contain control data for the reduction in unwanted radiation, which is important for ramp-up. Specifically, as to the last four symbols of twelve symbols of dummy (preamble data), four bits of each symbol are arranged to be e.g. "1101", "1001", "0011" and "1111". This means that in the EDGE transmission mode, the amplitude value resulting from amplitude modulation of continuous transmitter signals by successive symbols provides a smaller amplitude in comparison to the RMS amplitude value which offers a large constant amplitude. As a result, a digital baseband transmitter signal representing a small amplitude value is read out from the internal memory such as a built-in RAM or data register of the digital RF interface 1 of the RF IC, and supplied to the digital modulator 2. Then, the digital modulator 2 produces orthogonal digital baseband transmitter signals TxDBI and TxDBQ, and the orthogonal analog baseband transmitter signals TxABI and TxABQ are produced by the digital-to-analog converters and supplied to the transmission mixer 3. Thus, supply of the intermediate-frequency transmitter signal Vref corresponding to the small amplitude value of the phase modulation control loop PM LP and amplitude modulation control loop AM LP of the RF IC is started. As a result, before and after an elapse of the setting time during the time of ramp-up, the amplitude level of the RF transmitter input signal supplied to the inputs of the RF power amplifiers PA1 and PA2 of the power-amplifier module PAM from the feed circuit of the phase modulation control loop PM LP of the RF IC is changed from an RMS amplitude value offering a large constant amplitude to a small amplitude value. Thus, according to the embodiment of the invention, it is possible to reduce unwanted radiation important for ramp-up, during which the amplification factors of the RF power amplifiers PA1 and PA2 are increased.

The level down of the transmitter signal in course of ramp-up as described above is performed in adjustment of the last four symbols of data of the dummy (preamble) of the effective data Eff_D of the transmission data Tx_Data transferred to the RF IC from the baseband LSI, which has been shown in FIG. 5. The effective data Eff_D containing the dummy (preamble) can be created by a control program stored in an external non-volatile memory such as a non-volatile memory in the baseband LSI or a flash EEPROM memory incorporated in a mobile phone.

Also, the level down of the transmitter signal in course of ramp-up can be performed in the RF IC by means of another method. Basically, the effective data Eff_D containing a dummy (preamble) is produced in the baseband LSI, and transferred to the RF IC. However, transfer data of a portion lowered in level in course of ramp-up, which comes from the baseband LSI, is masked by a data correction circuit in the RF IC. The data correction circuit inserts a correction transmitter signal for level down of the transmitter signal in the masked portion, instead. The control of the signal masking and insertion can be performed by a control program stored in a non-volatile memory in the RF IC or an external non-volatile memory such as a flash EEPROM memory incorporated in a mobile phone.

<<Sending of Real Transmission Data after Completion of Ramp-Up>>

Reference is made to FIG. 4, here. Between completion of ramp-up at the time T5 and start of ramp-down at the time T6, transmission of a total of 148 symbols consisting of a tail bit of the first three symbols, a tail bit of the last three symbols, and transfer data Tr_Data of 142 symbols between them, which can be used in actual transmission is performed.

<<Ramp-Down Start Command>>

Now, reference is made to FIG. 4. At the time T6 a ramp-down start command Ramp_Down Start is transferred to the RF IC from the baseband LSI. Then, an internal operation sequence similar to the internal operation sequence of the RF IC between the time T4 and time T5 is executed between the time T6 and time T7. Thus, it is possible to reduce unwanted radiation important for ramp-down, during which the amplification factors of the RF power amplifiers PA1 and PA2 are decreased.

<<Detail of the Ramp-Up Operation Sequence>>

FIG. 6 is a time chart of assistance in explaining details of an operation sequence before and after an elapse of the setting time during the time of ramp-up in the EDGE transmission mode shown in FIG. 4.

The setting time is set by the sum of a transmission delay time Tx-Delay and a transmission timing offset Timing-offset. The transmission delay time Tx-Delay, which starts at the time T2 when the transmission mode on command Tx_Mode ON is transferred to the RF IC from the baseband LSI, is set to 72 microseconds in this example. The transmission timing offset Timing-offset, which starts after the transmission delay time Tx-Delay has elapsed, is set to 15 microseconds, in this example.

When a predetermined delay time Delay (corresponding to 18 Qb) has elapsed from the time T3 at which the transmission data internal transfer command Tx_Data ON is transferred to the RF IC from the baseband LSI, readout of straight 1's symbols, namely "1111" symbols of the first half portion of twelve symbols is executed. As a result, a digital baseband transmitter signal corresponding to an RMS amplitude value with a large constant amplitude is read out from the internal memory such as a built-in RAM or data register of the digital RF interface 1 of the RF IC. Hence, the analog baseband transmitter signals TxABI and TxABQ form analog signals corresponding to the RMS amplitude value with a large constant amplitude.

At the time T4, the ramp-up start command Ramp_Up Start is transferred to the RF IC from the baseband LSI. Then, load of the digital ramp data Ramp_Up Data for ramp-up into the internal memory of the digital RF interface 1 is started, and the supply to the first and second variable amplifiers MVGA and IVGA is performed. The digital ramp data Ramp_Up Data for ramp-up consists of 16 pieces of data. The first eight pieces of data take on the data value "0", and therefore the amplification factors of the RF power amplifiers PA1 and PA2 of the power-amplifier module PAM are set to be minimum.

The setting time elapses during the time of the first eight pieces of data being the data value "0". As a result, the last four symbols of the twelve symbols of dummy (preamble data) of the 168 symbols of effective data Eff_D and the three symbols before them are read out (see FIG. 5). The four bits of each of the last four symbols are "1101", "1001", "0011" and "1111". This means that the amplitude value of continuous transmitter signals resulting from AM modulation using successive symbols offers a smaller amplitude in comparison to the RMS amplitude value with a large constant amplitude. As a result, a digital baseband transmitter signal corresponding to the small amplitude value is read out from the internal memory such as a built-in RAM or data register of the digital RF interface 1 of the RF IC, and supplied to the digital modulator 2. Hence, the analog baseband transmitter signals TxABI and TxABQ have waveforms of an intermediate-amplitude value or a small amplitude value. In this way, it is possible to reduce unwanted radiation important for ramp-up, during which the amplification factors of the RF power amplifiers PA1 and PA2 are increased.

Now, the setting is made so that when five microseconds elapses from the transmission timing offset Timing-offset, the automatic power control voltage Vapc is raised in response to the digital ramp data Ramp_Up Data. Also, the setting is made so that at the time when a length of time of 16 Qb has elapsed after the start of ramp-up at the time T4, the control signal FEM_CONT for activating the analog front-end module FEM is changed in level from Low to High.

<<Reduction in Unwanted Radiation During Ramp-Up>>

FIG. 7 is a plot of assistance in explaining the effect of the reduction in unwanted radiation by the ramp-up operation sequence of the transmitter according to the embodiment of the invention shown in FIG. 1 in the EDGE transmission mode. In GMSK standard, it is defined that in ramp-up, the increase in the RF transmitter signal from each RF power amplifier varies between the characteristic curves L1 and L2. The characteristic curve L_rp_cnv shows a conventional common ramp-up characteristic. Particularly, as to a portion strong in signal intensity drawn by a broken line, the intensity of the RF transmitter signal can be changed at a rate over the GMSK standard rate owing to switching noise caused at switching circuits in the RF IC, or the manufacturing error of a semiconductor chip.

The characteristic curve L_rp_inv shows the ramp-up characteristic achieved by the embodiment of the invention shown in FIG. 1. The intensity of the RF transmitter signal of the portion of the conventional common ramp-up characteristic curve L_rp_cnv drawn by the broken line is adjusted. As a result, the risk of the intensity of the RF transmitter signal being changed at a rate over the GMSK standard rate owing to switching noise caused at switching circuits in the RF IC, or the manufacturing error of a semiconductor chip is reduced.

<<Detail of the Ramp-Down Operation Sequence>>

FIG. 8 is a time chart of assistance in explaining details of an operation sequence in ramp-down in the EDGE transmission mode shown in FIG. 4.

At the time T6, the ramp-down start command Ramp_Down Start is transferred to the RF IC from the baseband LSI. Then, load of digital ramp data Ramp_Down Data for ramp-down into the internal memory of the digital RF interface 1 from the baseband LSI is started, and the supply to the first variable amplifier MVGA and the second variable amplifier IVGA is performed. The digital ramp data Ramp_Down Data for ramp-down consists of 16 pieces of data. As data values of the first eight pieces of data descend as "1023", "1010", "900", "700" and so on, the amplification factors of the RF power amplifiers PA1 and PA2 of the power-amplifier module PAM are also decreased gradually.

Readout of the first four symbols of eight symbols of dummy added into the backend of the 168 symbols of effective data Eff_D is executed during the time of values of the first eight pieces of data decreasing (see FIG. 5). The four bits of each of the first four symbols are "1111", "0001", "0011" and "1111". This means that in the EDGE transmission mode, the amplitude value resulting from amplitude modulation provides a smaller amplitude in comparison to the RMS amplitude value which offers a large constant amplitude. As a result, a digital baseband transmitter signal corresponding to the small amplitude value is read out from the internal memory such as a built-in RAM or data register of the digital RF interface 1 of the RF IC, and supplied to the digital modulator 2. Hence, the analog baseband transmitter signals TxABI and TxABQ have waveforms of an intermediate-amplitude value or a small amplitude value. In this way, it is possible to reduce unwanted radiation important for ramp-down, during which the amplification factors of the RF power amplifiers PA1 and PA2 are decreased.

<<Reduction in Unwanted Radiation During Ramp-Down>>

FIG. 9 is a plot of assistance in explaining the effect of the reduction in unwanted radiation by the ramp-down operation sequence of the transmitter according to the embodiment of the invention shown in FIG. 1 in the EDGE transmission mode. In GMSK standard, it is defined that in ramp-down, the decrease in the RF transmitter signal from each RF power amplifier varies between the characteristic curves L1 and L2. The characteristic curve L_rp_cnv shows a conventional common ramp-down characteristic. Particularly, as to a portion strong in signal intensity drawn by a broken line, the intensity of the RF transmitter signal can be changed at a rate over the GMSK standard rate owing to switching noise caused at switching circuits in the RF IC, or the manufacturing error of a semiconductor chip.

The characteristic curve L_rp_inv shows the ramp-down characteristic achieved by the embodiment of the invention shown in FIG. 1. The intensity of the RF transmitter signal of the portion of the conventional common ramp-down characteristic curve L_rp_cnv drawn by the broken line is adjusted. As a result, the risk of the intensity of the RF transmitter signal being changed at a rate over the GMSK standard rate owing to switching noise caused at switching circuits in the RF IC, or the manufacturing error of a semiconductor chip is reduced.

<<Switching from GMSK Transmission Mode to Edge Transmission Mode>>

Figure 10:
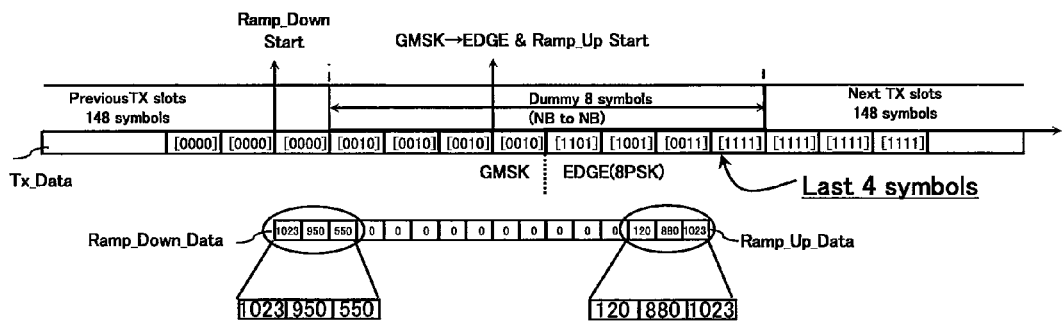
FIG. 10 is a time chart of assistance in explaining an operation sequence in the case of switching GMSK transmission mode to EDGE transmission mode.

FIG. 10 is a time chart of assistance in explaining an operation sequence in the case of switching GMSK transmission mode (normal burst) to EDGE transmission mode (normal burst).

The first half portion of FIG. 10 shows GMSK transmission mode, in which only phase modulation is adopted, and amplitude modulation is not implemented. Therefore, in the GMSK transmission mode of the first half portion, in the RF IC of the transmitter according to the embodiment of the invention shown in FIG. 1, the amplitude modulation control loop AM LP is not used at all. The back circuit of the phase modulation control loop PM LP and the back circuit of the amplitude modulation control loop AM LP share the couplers Cp11 and Cp12, the attenuators ATT1 and ATT2, the buffer amplifier BF1, the switch SW1, the down-conversion mixer DCM and the switch SW2. However, in the GMSK transmission mode shown in the first half portion of FIG. 10, the feedback to the phase comparator PD in the back circuit of the phase modulation control loop PM LP is particularly achieved by the passage through the buffer amplifier BF2, the switch SW1, the down-conversion mixer DCM and the switches SW2 and SW3, and the first variable amplifier MVGA is bypassed. Therefore, it is not necessary to attach importance to unwanted radiation during ramp-down at the time of the end of the GMSK transmission mode of the first half portion. Hence, as for the operation sequence shown by FIG. 10, no special measure is adopted for ramp-down at the end of the GMSK transmission mode of the first half portion.

However, in the EDGE transmission mode shown by the latter half portion, not only phase modulation but also amplitude modulation is used. Therefore, in the EDGE transmission mode shown by the latter half portion, in the RF IC of the transmitter according to the embodiment of the invention shown in FIG. 1, the amplitude modulation control loop AM LP is used, too. Hence, in ramp-up in the EDGE transmission mode shown by the latter half portion of FIG. 10, not-straight 1's data of the last four symbols of twelve symbols of the effective data Eff_D are used to perform the level down of the transmitter signal in course of ramp-up as in the ramp-up operation sequence in the EDGE transmission mode shown by FIG. 6. Hence, it is possible to reduce unwanted radiation during ramp-up in the EDGE transmission mode shown by the latter half portion of FIG. 10.

<<Switching from Edge Transmission Mode to GMSK Transmission Mode>>

Figure 11:
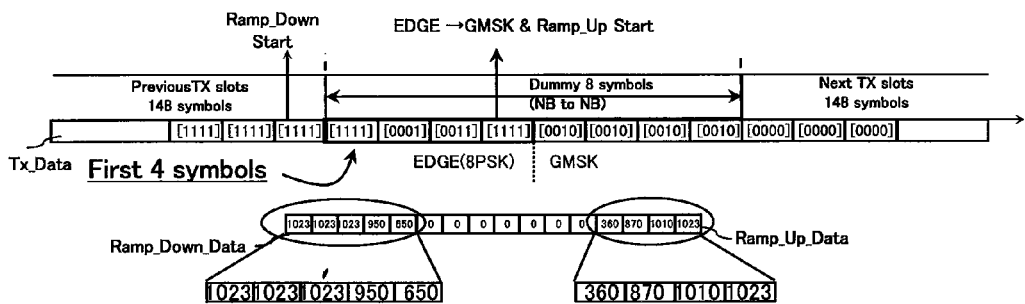
FIG. 11 is a time chart of assistance in explaining an operation sequence in the case of switching the EDGE transmission mode to the GMSK transmission mode.

FIG. 11 is a time chart of assistance in explaining an operation sequence in the case of switching the EDGE transmission mode (normal burst) to the GMSK transmission mode (normal burst).

In the EDGE transmission mode shown by the first half portion of FIG. 11, not only phase modulation, but also amplitude modulation is used. Therefore, in ramp-down in the EDGE transmission mode shown by the first half portion of FIG. 11, not-straight 1's data of the first four symbols of eight symbols added into the backend of the effective data Eff_D are used to perform the level down of the transmitter signal in course of ramp-down as in the ramp-down operation sequence in the EDGE transmission mode shown by FIG. 8. Hence, it is possible to reduce unwanted radiation during ramp-down in the EDGE transmission mode shown by the first half portion of FIG. 11. On the other hand, in the GMSK transmission mode shown by the latter half portion of FIG. 11, only phase modulation is adopted, and amplitude modulation is not implemented. Therefore, it is not necessary to attach importance to unwanted radiation during ramp-up at the time of start of the GMSK transmission mode shown by the latter half portion of FIG. 11. Hence, as for the operation sequence shown by FIG. 11, no special measure is adopted for ramp-up at the start of the GMSK transmission mode shown by the latter half portion.

<<Switching from Access Burst GMSK Transmission Mode to Normal Burst EDGE Transmission Mode>>

Figure 12:
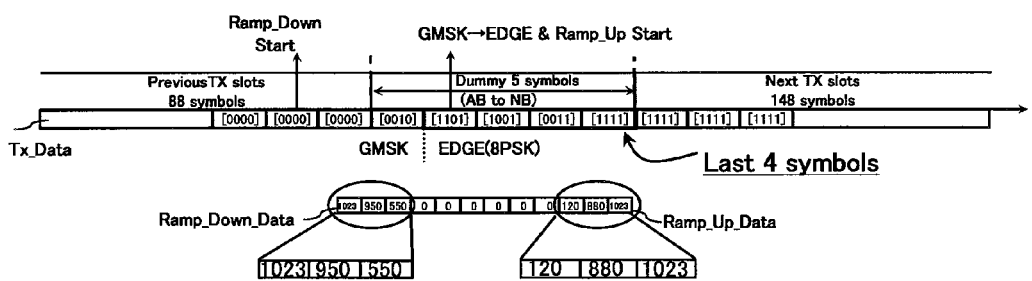
FIG. 12 is a time chart of assistance in explaining an operation sequence in the case of switching the GMSK transmission mode of access burst to the EDGE transmission mode of normal burst.

FIG. 12 is a time chart of assistance in explaining an operation sequence in the case of switching the GMSK transmission mode of access burst to the EDGE transmission mode of normal burst.

A communication terminal such as a mobile phone sends a base station connection data having a data structure different from that of the normal burst for sending real transmission data during an operation sequence termed "access burst" in order to notify a base station of its communication distance regularly. At the time of sending of access burst, the operation mode of the RF IC is set to the GMSK transmission mode. In some cases, after the access burst in the GMSK transmission mode, an end user can switch the operation mode to the EDGE transmission mode of normal burst. Switching of transmission mode as shown by FIG. 12 is caused in such situation.

Also, in the GMSK transmission mode of access burst of the first half portion of FIG. 12, only phase modulation is adopted, and amplitude modulation is not implemented. Therefore, it is not necessary to attach importance to unwanted radiation during ramp-down at the time of the end of the GMSK transmission mode of access burst of the first half portion. Hence, as for the operation sequence shown by FIG. 12, no special measure is adopted for ramp-down at the end of the GMSK transmission mode of access burst of the first half portion.

However, in the EDGE transmission mode of normal burst shown by the latter half portion, not only phase modulation but also amplitude modulation is used. Therefore, in the EDGE transmission mode shown by the latter half portion, in the RF IC of the transmitter according to the embodiment of the invention shown in FIG. 1, the amplitude modulation control loop AM LP is used, too. Hence, in ramp-up in the EDGE transmission mode of normal burst shown by the latter half portion of FIG. 12, not-straight 1's data of the last four symbols of twelve symbols of the effective data Eff_D are used to perform the level down of the transmitter signal in course of ramp-up as in the ramp-up operation sequence in the EDGE transmission mode shown by FIG. 6. Hence, it is possible to reduce unwanted radiation during ramp-up in the EDGE transmission mode of normal burst shown by the latter half portion of FIG. 12.

<<RF Transmission Spectra>>

The transmitter according to the embodiment of the invention shown in FIG. 1 enables reduction of unwanted radiation during ramp-up and ramp-down in the EDGE transmission mode.

Figure 13A:
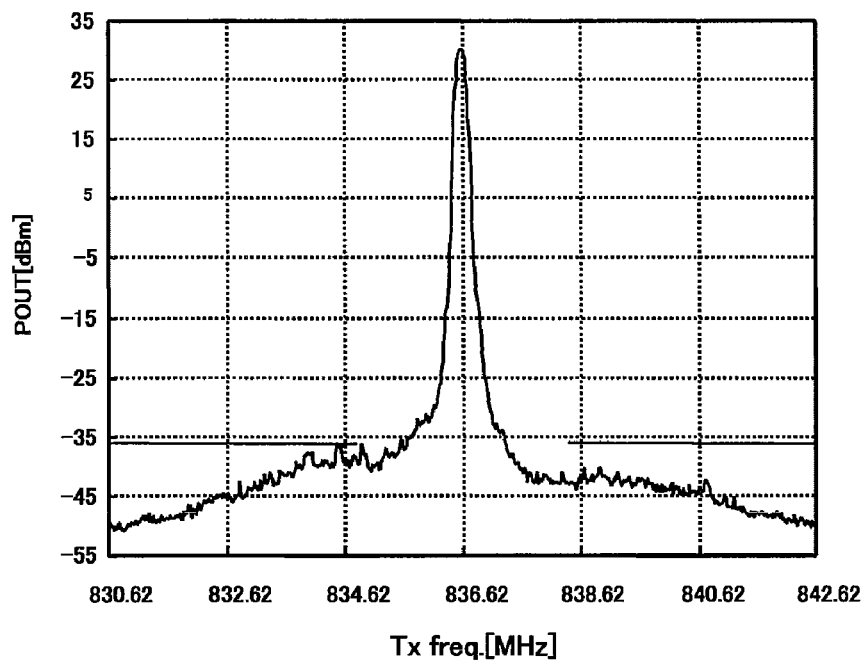
FIG. 13A is a plot showing RF transmission spectra obtained by a conventional common transmitter which performs ramp-up and ramp-down in the EDGE transmission mode.
Figure 13B:
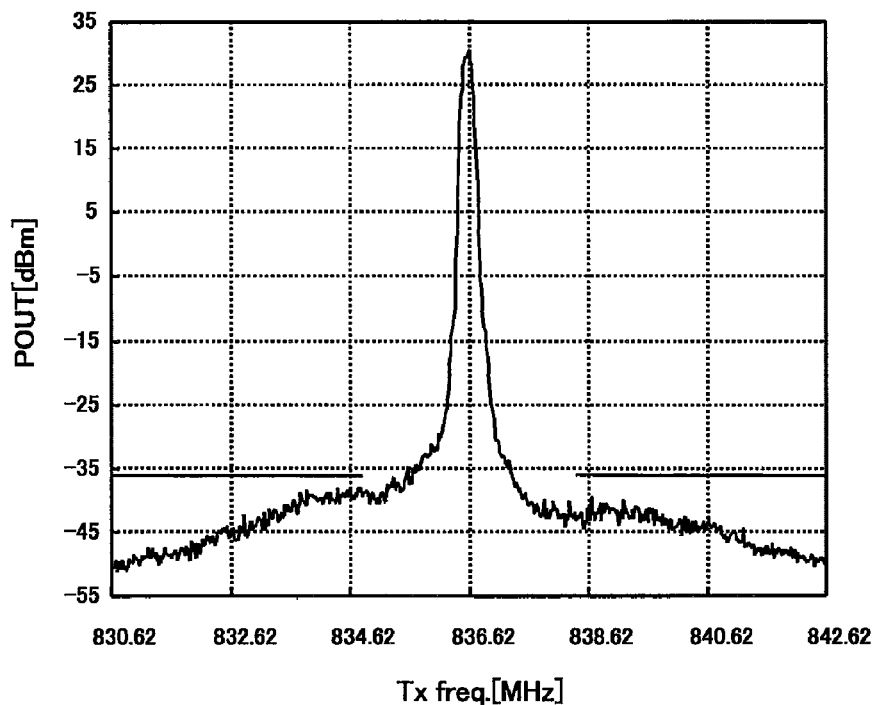
FIG. 13B is a plot showing RF transmission spectra achieved by the transmitter according to the embodiment of the invention shown in FIG. 1.

FIGS. 13A and 13B are plots showing RF transmission spectra obtained by a conventional common transmitter which performs ramp-up and ramp-down in the EDGE transmission mode, and RF transmission spectra achieved by the transmitter according to the embodiment of the invention shown in FIG. 1, respectively. FIG. 13A shows the characteristic of a conventional common transmitter, and FIG. 13B shows the characteristic of the transmitter shown in FIG. 1. The central frequency of RF transmitter output signals, which are outputs of the RF power amplifiers connected with the RF IC, is 836.62 MHz within the GSM850 band.

For unwanted radiation at an offset frequency obtained by offset of ±1.8 MHz with respect to the central frequency, the GMSK standard requires a quantity of suppression of −36 dBm or larger.

As for the characteristic of the conventional common transmitter shown in FIG. 13A, the margin with respect to the quantity of suppression according to the GMSK standard is insufficient in the vicinity of a frequency of 834.62 MHz near the lower offset frequency. In contrast, as can be seen from FIG. 13B, in regard to the characteristic of the transmitter according to the embodiment of the invention as shown in FIG. 1, the margin with respect to the quantity of suppression according to the GMSK standard is improved in the vicinity of the frequency of 834.62 MHz near the lower offset frequency.

<<Transmitter Supporting Edge Transmission Mode According to Polar Modulator System>>

The transmitter supporting the EDGE transmission mode as described above adopts the polar loop system, by which the control of ramp-up and ramp-down in the EDGE transmission mode is controlled by controlling the amplification factors of the RF power amplifiers PA1 and PA2. However, by use of the polar modulator system, which performs control while changing the levels of the RF transmitter input signals supplied to inputs of the RF power amplifiers, it is also possible to control ramp-up and ramp-down in EDGE transmission mode.

Figure 14:
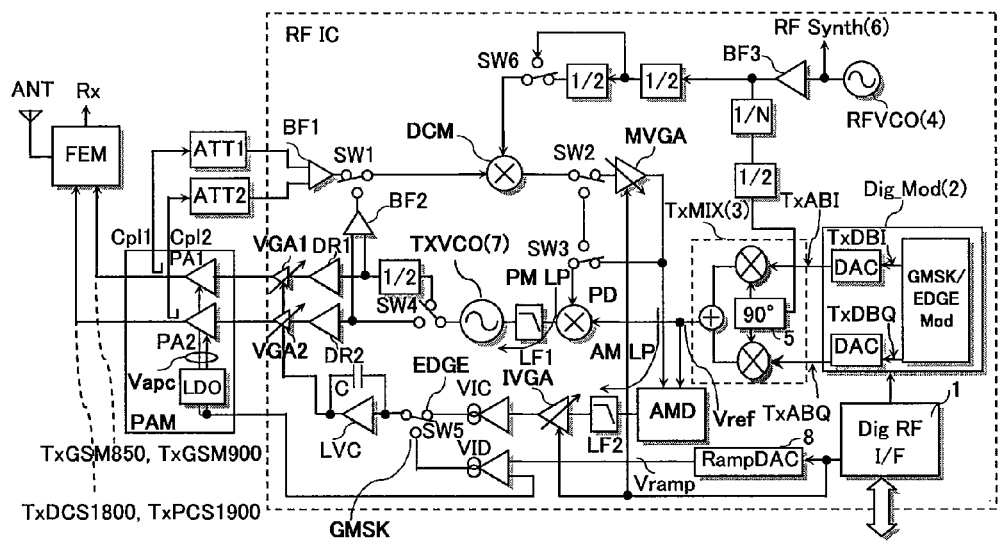
FIG. 14 is a diagram showing a transmitter according to another embodiment of the invention, which adopts the polar modulator system and supports the EDGE transmission mode.

FIG. 14 is a diagram showing a transmitter according to another embodiment of the invention, which adopts the polar modulator system and supports the EDGE transmission mode. Specifically, in the RF IC of the transmitter shown in FIG. 14, the control of ramp-up and ramp-down in the EDGE transmission mode is conducted by controlling the attenuation factors and amplification factors of variable amplifiers VGA1 and VGA2 connected between inputs of the RF power amplifiers PA1 and PA2 and outputs of the driver amplifiers DR1 and DR2. Levels of the attenuation factors and amplification factors of the variable amplifiers VGA1 and VGA2 are controlled by the output of the level converter LVC of the feed circuit of the amplitude modulation control loop AM LP. Other structures and operations of the RF IC of the transmitter shown in FIG. 14 are substantially the same as those of the RF IC of the transmitter shown in FIG. 1.

<<RF IC Incorporating Receiver>>

The above description has been presented focusing on a transmitter which performs EDGE transmission. However, it is needless to say that the RF IC needs the function of a receiver as a matter of course.

<<Multiband Transmission>>

Figure 15:
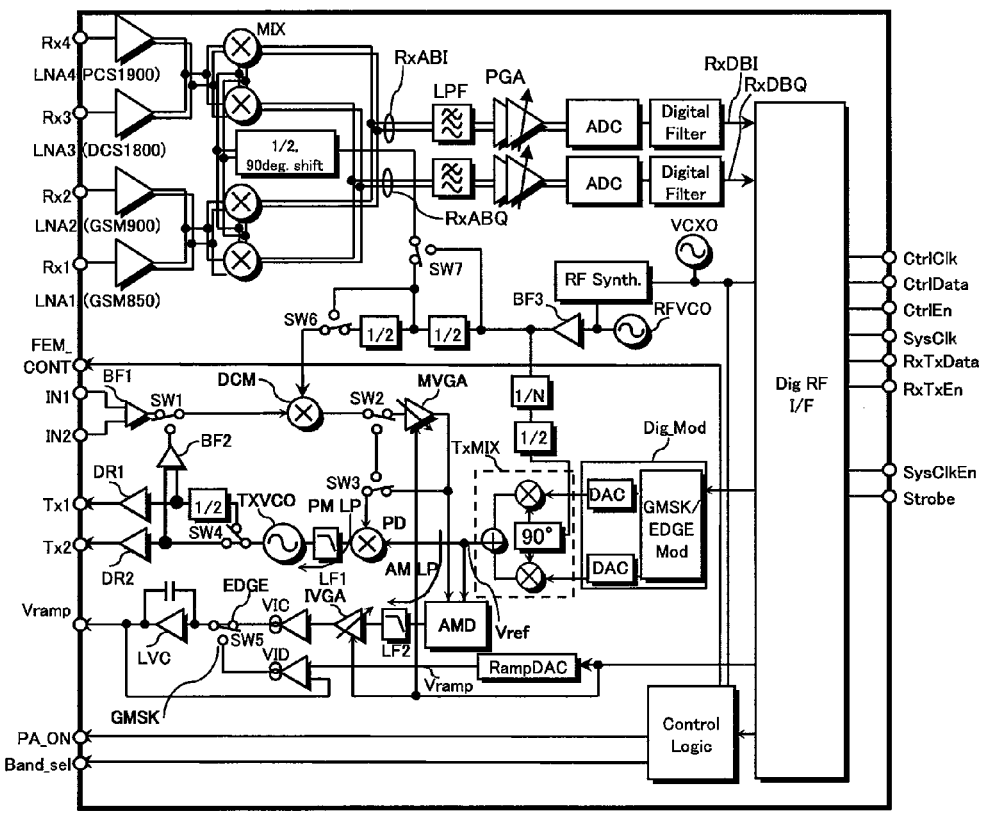
FIG. 15 is a diagram showing the RF IC according to the embodiment of the invention more specifically.

FIG. 15 is a diagram showing the RF IC according to the embodiment of the invention more specifically. In a lower portion of the drawing, a transmitter signal-processing circuit is laid out, which is arranged substantially the same as the transmitter signal-processing circuit of the RF IC of the transmitter shown in FIG. 1.

GSM850 RF transmitter output signals of 824 to 849 MHz and GSM900 RF transmitter output signals of 880 to 915 MHz produced in the RF IC are sent out through an output Tx1 of the driver amplifier DR1. Through an output Tx2 of the driver amplifier DR2, DCS1800 RF transmitter output signals of 1710 to 1785 MHz and PCS1900 RF transmitter output signals of 1850 to 1910 MHz produced in the RF IC are sent out. Incidentally, DCS is an abbreviation of Digital Cellular System, and PCS is an abbreviation of Personal Communication System.

<<Frequency Synthesizer>>

In the vicinities of the center of the RF IC shown in FIG. 15 are formed two ½ frequency dividers, an RF voltage control oscillator RF VCO, an RF frequency synthesizer RF Synth, and a system-reference oscillator VCXO for producing a clock of a system reference frequency of 26 MHz.

<<Receive of Multiband>>

In an upper portion of FIG. 15 is laid out a receive signal-processing circuit to realize the function of a receiver. The receive signal-processing circuit includes four low-noise amplifiers LNA1, LNA2, LNA3 and LNA4, two quadrature receive mixers, and a ½ frequency-dividing 90-degree phase shifter. To an input Rx1 of the low-noise amplifier LNA1, a GSM850 RF receive input signal of 869 to 894 MHz is supplied. To an input Rx2 of the low-noise amplifier LNA2, a GSM900 RF receive input signal of 925 to 960 MHz is supplied. To an input Rx3 of the low-noise amplifier LNA3, a DCS1800 RF receive input signal of 1805 to 1880 MHz is supplied. To an input Rx4 of the low-noise amplifier LNA4, a PCS1900 RF receive input signal of 1930 to 1990 MHz is supplied. The ½ frequency-dividing 90-degree phase shifter supplies two mixer circuits constituting each quadrature receive mixer with two RF local carrier signals for receiving, which differ in phase by 90 degrees. Hence, the quadrature receive mixers directly convert RF receive input signals into analog baseband receive signals RxABI and RxABQ. The analog baseband receive signals RxABI and RxABQ are passed through the low-pass filters LPF and then amplified by programmable gain amplifiers PGA. The resultant baseband amplification signals from the programmable gain amplifiers PGA are supplied to corresponding analog-to-digital converters ADC. Then, digital baseband receive signals RxDBI and RxDBQ from digital filters are supplied to a digital RF interface Dig RF I/F.

<<Digital RF Interface>>

In a right portion of FIG. 15, the digital RF interface Dig RF I/F for interfacing the RF IC with the baseband LSI to exchange various commands, transmission data and various pieces of control data is laid out. The digital RF interface Dig RF I/F adheres to the specifications of a digital interface described in the Non-patent Document presented by Andrew Fogg, "DigRF BASEBAND/RF DIGITAL INTERFACE SPECIFICATION".

To the digital RF interface Dig RF I/F is supplied with a control clock CtrlClk, control data CtrlData and a control enable signal CtrlEn. Their three lines are used to set operation modes of RF IC idle, transmission, receive, etc.

The digital RF interface Dig RF I/F produces a system clock signal SysClk to be supplied to the baseband LSI from the RF IC.

The digital RF interface Dig RF I/F has terminals for a transmission-and-receive data signal RxTxData and transmission-and-receive enable signal RxTxEn for bidirectional data communication between the RF IC and baseband LSI.

The digital RF interface Dig RF I/F is supplied with a system clock enable signal SysClkEn and a strobe signal Strobe from the baseband LSI.

<<Structure of Mobile Phone>>

Figure 16:
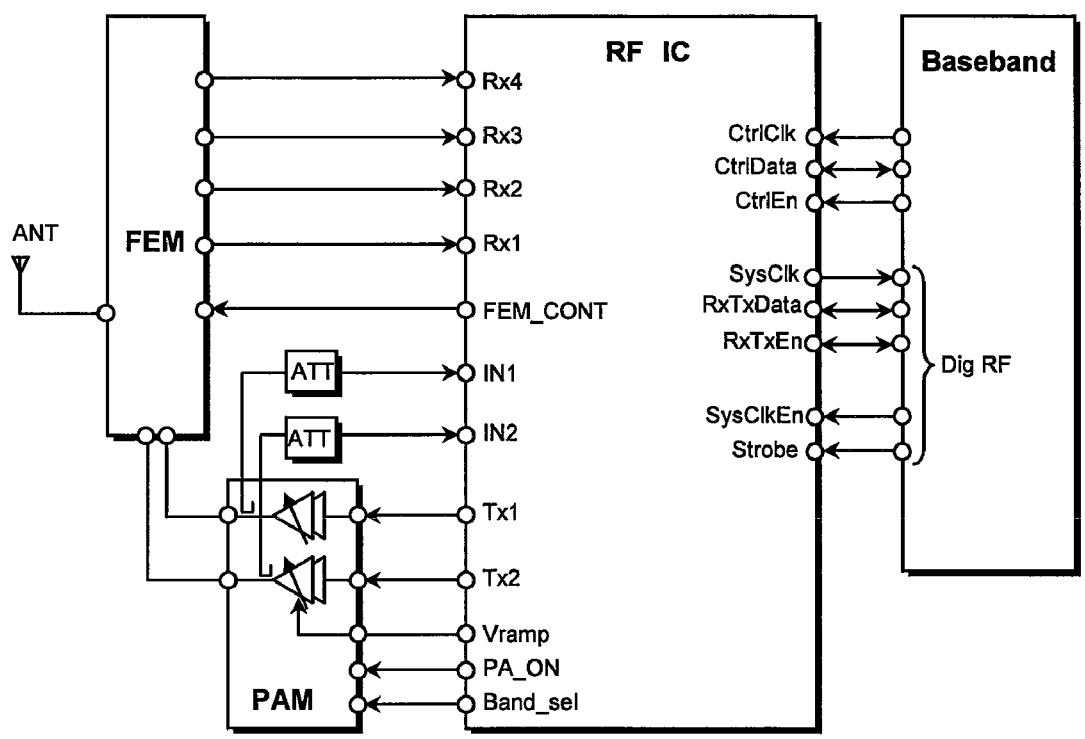
FIG. 16 is a block diagram showing a structure of a mobile phone incorporating an RF IC, a baseband LSI, a power-amplifier module, an analog front-end module and attenuators according to an embodiment of the invention.

FIG. 16 is a block diagram showing a structure of a mobile phone incorporating the RF IC, the baseband LSI, the power-amplifier module PAM, the analog front-end module FEM, and the attenuators ATT according to the embodiment of the invention as described above.

As in the drawing, an antenna ANT for receive and transmission of the mobile phone is connected with a common I/O terminal of the analog front-end module FEM. The RF IC supplies a control signal FEM_CONT to the analog front-end module FEM. The flow of RF signals from the antenna ANT for receive and transmission to the common I/O terminal of the analog front-end module FEM is involved in a receive operation RX of the mobile phone. The flow of RF signals from the common I/O terminal to the antenna ANT for receive and transmission is involved in a transmission operation TX of the mobile phone.

The RF IC converts a transmission baseband signal from the baseband LSI into an RF transmitter signal to up the frequency, and reversely converts an RF receive signal received with the antenna ANT for receive and transmission into a receive baseband signal to down the frequency, and supplies the resultant signal to the baseband LSI.

An antenna switch in the analog front-end module FEM establishes a signal path between the common I/O terminal and any of transmission terminals Tx1 and Tx2, and receive terminals Rx1, Rx2, Rx3 and Rx4, and then the receive operation RX or transmission operation TX is performed. A switch for the transmission and receive operation of an RF signal is composed of a HEMT (high electron mobility transistor), and the antenna switch is composed of a microwave monolithic integrated circuit (MMIC) using a compound semiconductor such as GaAs. The antenna switch MMIC is arranged so that required isolation is achieved by setting the impedance of a signal path other than the signal path established for the receive operation RX or transmission operation TX to an extremely high value. In the field of antenna switches, the common I/O terminal is termed "single pole", and a total of six terminals consisting of the transmission terminals Tx1 and Tx2, and the receive terminals Rx1, Rx2, Rx3 and Rx4 is termed "6 throw". Therefore, the antenna switch MMIC (ANT_SW) of FIG. 16 is a single pole 6-throw (SP6T: Single Pole 6-throw) type switch.

While the invention made by the inventors has been described above based on the embodiments specifically, the invention is not so limited. It is needless to say that various changes or modifications may be made without departing from the subject matter hereof.

In the case of the power-amplifier module PAM of the transmitter shown in FIG. 1, couplers operable to detect transmission powers of the RF power amplifiers electromagnetically or capacitively are adopted as the power couplers Cp11 and Cp12 for detecting transmission powers of the RF power amplifiers PA1 and PA2. Alternatively, current sensing type couplers may be adopted as the power couplers Cp11 and Cp12. In the current sensing type couplers, a small detection DC/AC operating current proportional to DC/AC operating current of a final-stage power amplifier element of each RF power amplifier is passed through a detection amplifier element.

Substantial stop of level up of the RF transmitter signal of the RF power amplifiers to be supplied to the antenna or level down thereof in course of ramp-up of the RF transmitter signal can be achieved by adjusting the digital value of the digital ramp data Ramp_Up Data during ramp-up. That is, such stop or level down is enabled by substantially stopping the increase in the digital value of the digital ramp data Ramp_Up Data or lowering the digital value during ramp-up.

Further, substantial stop of level down of the RF transmitter signal of the RF power amplifiers to be supplied to the antenna or level up thereof in course of ramp-down of the RF transmitter signal can be achieved by adjusting the digital value of the digital ramp data Ramp_Down Data during ramp-up. That is, such stop or level up is enabled by substantially stopping the decrease in the digital value of the digital ramp data Ramp_Down Data or raising the digital value during ramp-down.

In addition, in the above-described embodiments, the RF IC and the baseband LSI are composed of different semiconductor chips respectively. However, according to another embodiment, the RF IC may be integrated with the semiconductor chip of the baseband LSI into an integrated one-chip.

What is claimed is:

1. A transmitter comprising:
   an RF power amplifier for producing an RF transmitter signal to be supplied to an antenna; and
   an RF transmitter signal-processing circuit for converting up a baseband transmitter signal thereby to produce an RF transmitter input signal to be supplied to the RF power amplifier,
   wherein an internal operation of the RF transmitter signal-processing circuit is adjusted so that a level of the RF transmitter signal is raised, then the level of the RF transmitter signal is substantially stopped from rising, or made to descend, and the level of the RF transmitter signal is raised again in a course of ramp-up of the RF transmitter signal.

2. The transmitter of claim 1, wherein an internal operation of the RF transmitter signal-processing circuit is adjusted so that the level of the RF transmitter signal is lowered, then the level of the RF transmitter signal is substantially stopped from going down, or made to ascend, and the level of the RF transmitter signal is lowered again in a course of ramp-down of the RF transmitter signal.

3. The transmitter of claim 2, wherein ramp-up adjustment data contained in preamble data precedent to real transmission data transmitted after completion of the ramp-up enables adjustment of the internal operation of the RF transmitter signal-processing circuit in the course of the ramp-up.

4. The transmitter of claim 3, wherein the ramp-up adjustment data and real transmission data are supplied from a baseband processing unit.

5. The transmitter of claim 3, wherein ramp-down adjustment data contained in dummy data added to the real transmission data enables adjustment of the internal operation of the RF transmitter signal-processing circuit in the course of the ramp-down.

6. The transmitter of claim 5, wherein the ramp-down adjustment data is supplied from a baseband processing unit.

7. The transmitter of claim 5, wherein the RF transmitter signal-processing circuit includes a phase modulation control loop and an amplitude modulation control loop for producing the RF transmitter input signal by means of phase modulation and amplitude modulation,
   wherein the amplitude modulation control loop includes therein a first variable amplifier having a gain changed according to ramp information for the ramp-up and ramp-down, and
   wherein the ramp-up and ramp-down are enabled by controlling the gain of the first variable amplifier according to the ramp information.

8. The transmitter of claim 7, wherein the amplitude modulation control loop includes therein a second variable amplifier having a gain changed opposite in direction to the change in the gain of the first variable amplifier in response to the ramp information.

9. The transmitter of claim 8, wherein the amplitude modulation control loop constitutes one of a polar loop and a polar modulator for EDGE transmission.

10. An RF transmitter signal-processing circuit arranged so as to be connected with an RF power amplifier for producing an RF transmitter signal to be supplied to an antenna of a transmitter, the RF transmitter signal-processing circuit converting up a baseband transmitter signal thereby to produce an RF transmitter input signal to be supplied to the RF power amplifier,
    wherein an internal operation of the RF transmitter signal-processing circuit is adjusted so that a level of the RF transmitter signal is raised, then the level of the RF transmitter signal is substantially stopped from rising, or made to descend, and the level of the RF transmitter signal is raised again in a course of ramp-up of the RF transmitter signal.

11. The RF transmitter signal-processing circuit of claim 10, wherein an internal operation of the RF transmitter signal-processing circuit is adjusted so that the level of the RF transmitter signal is lowered, then the level of the RF transmitter signal is substantially stopped from going down, or made to ascend, and the level of the RF transmitter signal is lowered again in a course of ramp-down of the RF transmitter signal.

12. The RF transmitter signal-processing circuit of claim 11, wherein ramp-up adjustment data contained in preamble data precedent to real transmission data transmitted after completion of the ramp-up enables adjustment of the internal operation of the RF transmitter signal-processing circuit in the course of the ramp-up.

13. The RF transmitter signal-processing circuit of claim 12, wherein the ramp-up adjustment data and real transmission data are supplied from a baseband processing unit.

14. The RF transmitter signal-processing circuit of claim 12, wherein ramp-down adjustment data contained in dummy data added to the real transmission data enables adjustment of the internal operation of the RF transmitter signal-processing circuit in the course of the ramp-down.

15. The RF transmitter signal-processing circuit of claim 14, wherein the ramp-down adjustment data is supplied from a baseband processing unit.

16. The RF transmitter signal-processing circuit of claim 14, wherein the RF transmitter signal-processing circuit includes a phase modulation control loop and an amplitude modulation control loop for producing the RF transmitter input signal by means of phase modulation and amplitude modulation,
wherein the amplitude modulation control loop includes therein a first variable amplifier having a gain changed according to ramp information for the ramp-up and ramp-down, and
wherein the ramp-up and ramp-down are enabled by controlling the gain of the first variable amplifier according to the ramp information.

17. The RF transmitter signal-processing circuit of claim 16, wherein the amplitude modulation control loop includes therein a second variable amplifier having a gain changed opposite in direction to the change in the gain of the first variable amplifier in response to the ramp information.

18. The RF transmitter signal-processing circuit of claim 17, wherein the amplitude modulation control loop constitutes one of a polar loop and a polar modulator for EDGE transmission.

19. A method for operating the transmitter comprising:
a preparation step of preparing an RF power amplifier for producing an RF transmitter signal to be supplied to an antenna, and an RF transmitter signal-processing circuit for converting up a baseband transmitter signal thereby to produce an RF transmitter input signal to be supplied to the RF power amplifier;
a ramp-up adjustment step of adjusting an internal operation of the RF transmitter signal-processing circuit so that a level of the RF transmitter signal is raised, then the level of the RF transmitter signal is substantially stopped from rising, or made to descend, and the level of the RF transmitter signal is raised again in a course of ramp-up of the RF transmitter signal; and
a ramp-up step of making the RF transmitter signal ramp up after the ramp-up adjustment step.

20. The method for operating the transmitter of claim 19, further comprising:
a ramp-down adjustment step of adjusting an internal operation of the RF transmitter signal-processing circuit so that the level of the RF transmitter signal is lowered, then the level of the RF transmitter signal is substantially stopped from going down, or made to ascend, and the level of the RF transmitter signal is lowered again in a course of ramp-down of the RF transmitter signal; and
a ramp-down step of making the RF transmitter signal ramp down after the ramp-down adjustment step.

21. The method for operating the transmitter of claim 20, wherein the ramp-up adjustment step, ramp-up step, ramp-down adjustment step and ramp-down step are controlled by software programs stored in a non-volatile storage device incorporated in the transmitter.

22. A transmitter comprising:
an RF power amplifier for producing an RF transmitter signal to be supplied to an antenna; and
an RF transmitter signal-processing circuit for converting up a baseband transmitter signal thereby to produce an RF transmitter input signal to be supplied to the RF power amplifier,
wherein an internal operation of the RF transmitter signal-processing circuit is adjusted so that a level of the RF transmitter signal is lowered, then the level of the RF transmitter signal is substantially stopped from going down, or made to ascend, and the level of the RF transmitter signal is lowered again in a course of ramp-down of the RF transmitter signal.

23. The transmitter of claim 22, wherein ramp-down adjustment data contained in dummy data added to a real transmission data enables adjustment of the internal operation of the RF transmitter signal-processing circuit in the course of the ramp-down.

24. The transmitter of claim 23, wherein the ramp-down adjustment data is supplied from a baseband processing unit.

25. A transmitter comprising:
an RF power amplifier for producing an RF transmitter signal to be supplied to an antenna; and
an RF transmitter signal-processing circuit for converting up a baseband transmitter signal thereby to produce an RF transmitter input signal to be supplied to the RF power amplifier,
wherein a ramp-up of the RF transmitter signal is controlled by ramp information supplied form a baseband processing unit, and
wherein an internal operation of the RF transmitter signal-processing circuit is adjusted so that a level of the RF transmitter signal is raised, then the level of the RF transmitter signal is substantially stopped from rising, or made to descend, and the level of the RF transmitter signal is raised again in a course of the ramp-up of the RF transmitter signal.

26. The transmitter of claim 25,
wherein a ramp-down of the RF transmitter signal is controlled by the ramp information supplied from a baseband processing unit, and
wherein an internal operation of the RF transmitter signal-processing circuit is adjusted so that the level of the RF transmitter signal is lowered, then the level of the RF transmitter signal is substantially stopped from going down, or made to ascend, and the level of the RF transmitter signal is lowered again in the course of the ramp-down of the RF transmitter signal.

27. The transmitter of claim 26, wherein the RF transmitter signal-processing circuit includes a phase modulation control loop and an amplitude modulation control loop for producing the RF transmitter input signal by means of phase modulation and amplitude modulation,
the amplitude modulation control loop includes therein a first variable amplifier having a gain changed according to the ramp information for the ramp-up and the ramp-down, and
the ramp-up and the ramp-down are enabled by controlling the gain of the first variable amplifier according to the ramp information.

28. The transmitter of claim 27, wherein the amplitude modulation control loop includes therein a second variable amplifier having a gain changed opposite in direction to the change in the gain of the first variable amplifier in response to the ramp information.

29. The transmitter of claim 28, wherein the amplitude modulation control loop constitutes one of a polar loop and a polar modulator for EDGE transmission.

* * * * *